(12) United States Patent
Park et al.

(10) Patent No.: US 12,165,563 B2
(45) Date of Patent: Dec. 10, 2024

(54) SCAN DRIVER AND DISPLAY DEVICE

(71) Applicant: Samsung Display Co., LTD., Yongin-si (KR)

(72) Inventors: Gyungsoon Park, Seoul (KR); Sunhwa Lee, Yongin-si (KR); Jaeyong Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/944,044

(22) Filed: Sep. 13, 2022

(65) Prior Publication Data
US 2023/0186824 A1    Jun. 15, 2023

(30) Foreign Application Priority Data

Dec. 14, 2021   (KR) .......................... 10-2021-0178248

(51) Int. Cl.
*G09G 3/20*      (2006.01)
*G09G 3/3266*    (2016.01)
(Continued)

(52) U.S. Cl.
CPC ......... *G09G 3/2092* (2013.01); *G09G 3/3266* (2013.01); *G09G 3/20* (2013.01);
(Continued)

(58) Field of Classification Search
CPC ......... G09G 3/2092; G09G 2300/0852; G09G 2300/0847; G09G 2310/0267;
(Continued)

(56) References Cited

U.S. PATENT DOCUMENTS

2010/0134399 A1*   6/2010   Ki .................. G11C 19/184
                                                345/94
2013/0249884 A1*   9/2013   Kim ................ G09G 3/3677
                                                345/212
(Continued)

FOREIGN PATENT DOCUMENTS

| KR | 10-2018-0072041 A | 6/2018 |
| KR | 10-2020-0118315 A | 10/2020 |
| KR | 10-2174833 B1     | 11/2020 |

OTHER PUBLICATIONS

English translation for KR 2020 0118315, Assignee Samsung Display Co Ltd, publication date Oct. 15, 2020. (Year: 2020).*

*Primary Examiner* — William Boddie
*Assistant Examiner* — Saifeldin E Elnafia
(74) *Attorney, Agent, or Firm* — Lewis Roca Rothgerber Christie LLP

(57) ABSTRACT

A scan driver includes stages including an input block to change a first node voltage to a gate on voltage based on an input signal, a second node control block to control second node voltage based on a first clock signal and the first node voltage, a scan output block to output a second clock signal as a scan signal based on the first node voltage, and to output a first gate off voltage as the scan signal based on the second node voltage, a carry output block to output the second clock signal as a carry signal based on the first node voltage, and to output a second gate off voltage different from the first gate off voltage as the carry signal based on the second node voltage, and a first node control block to transfer the carry signal to the first node based on a next carry signal.

18 Claims, 16 Drawing Sheets

(51) Int. Cl.
    *G09G 3/3225* (2016.01)
    *G09G 3/3275* (2016.01)
    *G09G 3/36* (2006.01)
    *G11C 19/28* (2006.01)

(52) U.S. Cl.
    CPC ......... *G09G 3/3225* (2013.01); *G09G 3/3275* (2013.01); *G09G 3/3677* (2013.01); *G09G 2300/0852* (2013.01); *G09G 2310/0267* (2013.01); *G09G 2310/0275* (2013.01); *G09G 2310/0278* (2013.01); *G09G 2310/0286* (2013.01); *G09G 2310/08* (2013.01); *G11C 19/28* (2013.01)

(58) Field of Classification Search
    CPC ... G09G 2310/0264; G09G 2310/0275; G09G 2310/0278; G09G 3/20; G09G 3/3266; G09G 3/3225; G09G 3/3275; G09G 3/3677; G09G 2310/0286; G09G 2310/08; G11C 19/28
    See application file for complete search history.

(56) References Cited

U.S. PATENT DOCUMENTS

2017/0316732 A1* 11/2017 Na .......................... G09G 3/20
2019/0347997 A1* 11/2019 Park ...................... G11C 19/28

\* cited by examiner

SCAN DRIVER AND DISPLAY DEVICE

CROSS-REFERENCE TO RELATED APPLICATION

This application claims priority to, and the benefit of, Korean Patent Application No. 10-2021-0178248, filed on Dec. 14, 2021 in the Korean Intellectual Property Office (KIPO), the content of which is herein incorporated by reference in its entirety.

BACKGROUND

1. Field

Embodiments of the present disclosure relate to a scan driver, and a display device including the scan driver.

2. Description of the Related Art

A display device may include a display panel having a plurality of pixels, a data driver for providing data signals to the plurality of pixels, a scan driver for providing scan signals to the plurality of pixels, and a controller for controlling the data driver and the scan driver.

Recently, a display device in which each pixel includes oxide transistors or n-type metal oxide semiconductor (NMOS) transistors is being developed. Accordingly, a scan driver suitable for the pixel including the oxide transistors or the NMOS transistors is required.

SUMMARY

Some embodiments provide a scan driver having improved operation reliability.

Some embodiments provide a display device including a scan driver having improved operation reliability.

According to one or more embodiments, there is provided a scan driver including stages, the stages including an input block configured to change a voltage of a first node to a gate on voltage based on an input signal, a second node control block configured to control a voltage of a second node in response to a first clock signal and the voltage of the first node, a scan output block configured to output a second clock signal as a scan signal in response to the voltage of the first node, and to output a first gate off voltage as the scan signal in response to the voltage of the second node, a carry output block configured to output the second clock signal as a carry signal in response to the voltage of the first node, and to output a second gate off voltage that is different from the first gate off voltage as the carry signal in response to the voltage of the second node, and a first node control block configured to transfer the carry signal to the first node in response to a next stage carry signal.

An absolute value of the second gate off voltage may be greater than an absolute value of the first gate off voltage.

The stages may further include n-type metal oxide semiconductor (NMOS) transistors, wherein the gate on voltage is a high gate voltage, wherein the first and second gate off voltages are respectively first and second low gate voltages, and wherein the second low gate voltage is lower than the first low gate voltage.

The input block may include a first transistor including a gate for receiving the input signal, a first terminal for receiving the gate on voltage, and a second terminal coupled to the first node.

The input block may include a first transistor including a gate for receiving the first clock signal, a first terminal for receiving the input signal, and a second terminal coupled to the first node.

The second node control block may include a second transistor including a gate coupled to the first node, a first terminal for receiving the first clock signal, and a second terminal coupled to the second node, and a third transistor including a gate for receiving the first clock signal, a first terminal coupled to the second node, and a second terminal for receiving the gate on voltage.

The scan output block may include a fourth transistor including a gate coupled to the first node, a first terminal for receiving the second clock signal, and a second terminal coupled to a scan output node configured to output the scan signal, and a fifth transistor including a gate coupled to the second node, a first terminal coupled to the scan output node, and a second terminal for receiving the first gate off voltage.

A gate-source voltage of the fourth transistor may be a negative voltage while the first gate off voltage is output as the scan signal.

A gate-source voltage of the fourth transistor may correspond to the first gate off voltage subtracted from the second gate off voltage while the first gate off voltage is output as the scan signal.

The scan output block may further include a first capacitor including a first electrode coupled to the second node, and a second electrode for receiving the first gate off voltage.

The carry output block may include a sixth transistor including a gate coupled to the first node, a first terminal for receiving the second clock signal, and a second terminal coupled to a carry output node configured to output the carry signal, and a seventh transistor including a gate coupled to the second node, a first terminal coupled to the carry output node, and a second terminal for receiving the second gate off voltage.

The carry output block may further include a second capacitor including a first electrode coupled to the first node, and a second electrode coupled to the carry output node.

The first node control block may include an eighth transistor including a gate for receiving the next stage carry signal, a first terminal for receiving the carry signal, and a second terminal coupled to the first node.

The first node control block may further include a ninth transistor including a gate for receiving the second clock signal, a first terminal coupled to the first node, and a second terminal, and a tenth transistor including a gate coupled to the second node, a first terminal coupled to the second terminal of the ninth transistor, and a second terminal coupled to a carry output node at which the carry signal is output.

While the voltage of the second node is the gate on voltage, the ninth and tenth transistors may periodically couple the first node and the carry output node in response to the second clock signal.

The stages may further include an eleventh transistor located at the first node, and including a gate for receiving the gate on voltage.

According to one or more embodiments, there is provided a scan driver including stages, the stages including a first transistor including a gate for receiving an input signal, a first terminal for receiving a gate on voltage, and a second terminal coupled to a first node, a second transistor including a gate coupled to the first node, a first terminal for receiving a first clock signal, and a second terminal coupled to a second node, a third transistor including a gate for receiving the first clock signal, a first terminal coupled to the second node, and a second terminal for receiving the gate on voltage, a fourth transistor including a gate coupled to the first node, a first terminal for receiving a second clock signal, and a second terminal coupled to a scan output node, a fifth transistor including a gate coupled to the second node, a first terminal coupled to the scan output node, and a second terminal for receiving a first gate off voltage, a first capacitor including a first electrode coupled to the second node, and a second electrode for receiving the first gate off voltage, a sixth transistor including a gate coupled to the first node, a first terminal for receiving the second clock signal, and a second terminal coupled to a carry output node, a seventh transistor including a gate coupled to the second node, a first terminal coupled to the carry output node, and a second terminal for receiving a second gate off voltage that is different from the first gate off voltage, a second capacitor including a first electrode coupled to the first node, and a second electrode coupled to the carry output node, and an eighth transistor including a gate for receiving a next stage carry signal, a first terminal for receiving a carry signal at the carry output node, and a second terminal coupled to the first node.

The first through eighth transistors may include n-type metal oxide semiconductor (NMOS) transistors, wherein the gate on voltage is a high gate voltage, wherein the first and second gate off voltages are first and second low gate voltages, respectively, and wherein the second low gate voltage is lower than the first low gate voltage.

The stages may further include a ninth transistor including a gate for receiving the second clock signal, a first terminal coupled to the first node, and a second terminal, and a tenth transistor including a gate coupled to the second node, a first terminal coupled to the second terminal of the ninth transistor, and a second terminal coupled to the carry output node.

According to one or more embodiments, there is provided a display device including a display panel including pixels, a data driver configured to provide data signals to the pixels, a scan driver including stages configured to provide scan signals to the pixels, and a controller configured to control the data driver and the scan driver, wherein the stages include an input block configured to change a voltage of a first node to a gate on voltage based on an input signal, a second node control block configured to control a voltage of a second node in response to a first clock signal and the voltage of the first node, a scan output block configured to output a second clock signal as a corresponding scan signal of the scan signals in response to the voltage of the first node, and to output a first gate off voltage as the corresponding scan signal in response to the voltage of the second node, a carry output block configured to output the second clock signal as a carry signal in response to the voltage of the first node, and to output a second gate off voltage that is different from the first gate off voltage as the carry signal in response to the voltage of the second node, and a first node control block configured to transfer the carry signal to the first node in response to a next stage carry signal.

As described above, in a scan driver and a display device according to one or more embodiments, a second low gate voltage for a carry signal may be different from a first low gate voltage for a scan signal, and the second low gate voltage may be applied to a first node of each stage. Accordingly, a leakage current of a transistor for outputting the scan signal may be reduced in each stage, a ripple may not occur in the scan signal, and operation reliability of the scan driver may be improved.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
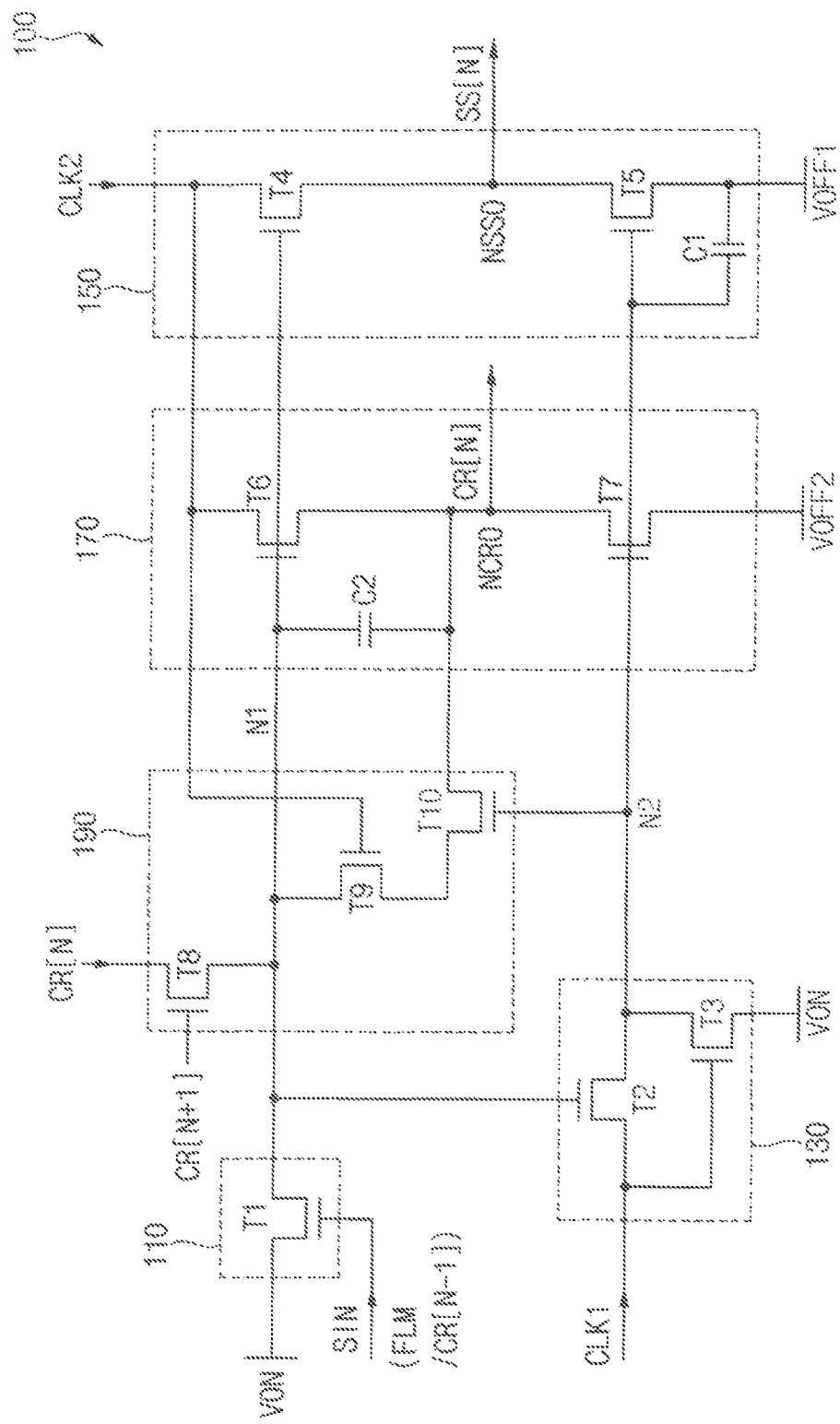
FIG. 1 is a circuit diagram illustrating a stage included in a scan driver according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present. It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

The electronic or electric devices and/or any other relevant devices or components according to one or more embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a circuit diagram illustrating a stage included in a scan driver according to one or more embodiments.

Referring to FIG. 1, a scan driver according to one or more embodiments may include a plurality of stages. A stage 100 may include an input block 110 that receives an input signal SIN, a first node control block 190 that controls a first node N1, a second node control block 130 that controls a second node N2, a scan output block 150 that outputs a scan signal SS[N], and a carry output block 170 that outputs a carry signal CR.

The input block 110 may change a voltage of the first node N1 (e.g., a Q node) to a gate on voltage VON based on the input signal SIN. In some embodiments, the input signal SIN may be a scan start signal FLM in a case where the stage 100 is a first one of the plurality of stages, and may be a previous stage carry signal CR[N−1] in a case where the stage 100 is a subsequent stage of the plurality of stages. In some embodiments, the gate on voltage VON may be a high gate voltage. In other embodiments, the gate on voltage VON may be a low gate voltage.

Further, the input block 110 may transfer the gate on voltage VON to the first node N1 in response to the input signal SIN. In a case where the gate on voltage VON, which may be a direct current (DC) voltage, is transferred to the first node N1, the voltage of the first node N1 may be more stably changed to a desired voltage (e.g., to the gate on voltage VON), as compared with a case where the input signal SIN (e.g., the previous stage carry signal CR[N−1]) is transferred to the first node N1. In some embodiments, as illustrated in FIG. 1, the input block 110 may include a first transistor T1 including a gate for receiving the input signal SIN, a first terminal for receiving the gate on voltage VON, and a second terminal coupled to the first node N1.

The second node control block 130 may control a voltage of the second node N2 (e.g., a QB node) in response to a first clock signal CLK1 and the voltage of the first node N1. The second node control block 130 may transfer the first clock signal CLK1 to the second node N2 in response to the voltage of the first node N1, and may transfer the gate on voltage VON to the second node N2 in response to the first clock signal CLK1. In some embodiments, as illustrated in FIG. 1, the second node control block 130 may include a second transistor T2 including a gate coupled to the first node N1, a first terminal for receiving the first clock signal CLK1, and a second terminal coupled to the second node N2, and a third transistor T3 including a gate for receiving the first clock signal CLK1, a first terminal coupled to the second node N2, and a second terminal for receiving the gate on voltage VON.

The scan output block 150 may output a second clock signal CLK2 as the scan signal SS[N] in response to the voltage of the first node N1, and may output a first gate off voltage VOFF1 as the scan signal SS[N] in response to the voltage of the second node N2. To perform this operation, the scan output block 150 may include a fourth transistor T4 that transfers the second clock signal CLK2 to a scan output node NSSO at which the scan signal SS[N] is output in response to the voltage of the first node N1, and a fifth transistor T5 that transfers the first gate off voltage VOFF1 to the scan output node NSSO in response to the voltage of the second node N2. In some embodiments, as illustrated in FIG. 1, the fourth transistor T4 may include a gate coupled to the first node N1, a first terminal for receiving the second clock signal CLK2, and a second terminal coupled to the scan output node NSSO, and the fifth transistor T5 may include a gate coupled to the second node N2, a first terminal coupled to the scan output node NSSO, and a second terminal for receiving the first gate off voltage VOFF1.

In some embodiments, the scan output block 150 may further include a first capacitor C1 for holding the voltage of the second node N2. For example, as illustrated in FIG. 1, the first capacitor C1 may include a first electrode coupled to the second node N2, and a second electrode for receiving the first gate off voltage VOFF1. Although FIG. 1 illustrates an example where the scan output block 150 includes the first capacitor C1 for holding the voltage of the second node N2, in other embodiments, the first capacitor C1 may be included in the carry output block 170. In this case, the second electrode of the first capacitor C1 may receive a second gate off voltage VOFF2 instead of the first gate off voltage VOFF1. In some embodiments, the first and second gate off voltages VOFF1 and VOFF2 may be, respectively, first and second low gate voltages that are different from each other. In other embodiments, the first and second gate off voltages VOFF1 and VOFF2 may be, respectively, first and second high gate voltages that are different from each other.

The carry output block 170 may output the second clock signal CLK2 as the carry signal CR[N] in response to the voltage of the first node N1, and may output the second gate off voltage VOFF2, which is different from the first gate off voltage VOFF1, as the carry signal CR[N] in response to the voltage of the second node N2. In some embodiments, an absolute value of the second gate off voltage VOFF2 may be greater than an absolute value of the first gate off voltage VOFF1. For example, in a case where the first and second gate off voltages VOFF1 and VOFF2 are positive voltages, the second gate off voltage VOFF2 may be higher than the first gate off voltage VOFF1. In another example, in a case where the first and second gate off voltages VOFF1 and VOFF2 are negative voltages, the second gate off voltage VOFF2 may be lower than the first gate off voltage VOFF1.

To perform this operation, the carry output block 170 may include a sixth transistor T6 that transfers the second clock signal CLK2 to a carry output node NCRO at which the carry signal CR[N] is output in response to the voltage of the first node N1, and a seventh transistor T7 that transfers the second gate off voltage VOFF2 to the carry output node NCRO in response to the voltage of the second node N2. In some embodiments, as illustrated in FIG. 1, the sixth transistor T6 may include a gate coupled to the first node N1, a first terminal for receiving the second clock signal CLK2, and a second terminal coupled to the carry output node NCRO, and the seventh transistor T7 may include a gate coupled to the second node N2, a first terminal coupled to the carry output node NCRO, and a second terminal for receiving the second gate off voltage VOFF2.

In some embodiments, the carry output block 170 may further include a second capacitor C2 for boosting the voltage of the first node N1. The voltage of the first node N1 may be boosted by the second capacitor C2, and thus the fourth and sixth transistors T4 and T6 may readily transfer the second clock signal CLK2 having an on level (e.g., a high level) to the scan and carry output nodes NSSO and NCRO, respectively. In some embodiments, the second capacitor C2 may be referred to as a boosting capacitor or a bootstrap capacitor. For example, as illustrated in FIG. 1, the second capacitor C2 may include a first electrode coupled to the first node N1, and a second electrode coupled to the carry output node NCRO. Although FIG. 1 illustrates an example where the carry output block 170 includes the second capacitor C2 for boosting the voltage of the first node N1, in other embodiments, the second capacitor C2 may be included in the scan output block 150. In this case, the second electrode of the second capacitor C2 may be coupled to the scan output node NSSO instead of the carry output node NCRO.

The first node control block 190 may transfer the carry signal CR[N] to the first node N1 in response to a next stage carry signal CR[N+1]. Here, the next stage carry signal CR[N+1] may be a carry signal generated by a stage subsequent to the stage 100 among the plurality of stages. Further, the stage subsequent to the stage 100 shown in FIG. 1 may receive the carry signal CR[N] of the stage 100 as the input signal SIN. For example, the next stage carry signal CR[N+1] for an N-th stage 100 may be a carry signal CR[N+1] output from an (N+1)-th stage, where N is an integer greater than 0. To perform this operation, in some embodiments, the first node control block 190 may include an eighth transistor T8 that transfers the carry signal CR[N] having the second off voltage VOFF2 to the first node N1 in response to the next stage carry signal CR[N+1] having the on level (e.g., the high level). For example, as illustrated in FIG. 1, the eighth transistor T8 may include a gate for receiving the next stage carry signal CR[N+1], a first terminal for receiving the carry signal CR[N], and a second terminal coupled to the first node N1.

In some embodiments, while the voltage of the second node N2 has the on level, or while the voltage of the second node N2 is the gate on voltage VON, the first node control block 190 may periodically couple the first node N1 and the carry output node NCRO in response to the second clock signal CLK2. Thus, while the voltage of the second node N2 is the gate on voltage VON, the seventh transistor T7 may transfer the second gate off voltage VOFF2 to the carry output node NCRO, and the first node control block 190 may periodically transfer the second gate off voltage VOFF2 to the first node N1 in response to the second clock signal CLK2. To perform this operation, in some embodiments, the first node control block 190 may further include ninth and tenth transistors T9 and T10 that couple the first node N1 and the carry output node NCRO in response to the second clock signal CLK2 and the voltage of the second node N2. For example, as illustrated in FIG. 1, the ninth transistor T9 may include a gate for receiving the second clock signal CLK2, a first terminal coupled to the first node N1, and a second terminal, and the tenth transistor T10 may include a gate coupled to the second node N2, a first terminal coupled to the second terminal of the ninth transistor T9, and a second terminal coupled to the carry output node NCRO.

In some embodiments, as illustrated in FIG. 1, all transistors T1 through T10 included in a stage 100 may be n-type metal oxide semiconductor (NMOS) transistors or NMOS oxide transistors. The scan driver in which a stage 100 includes the NMOS oxide transistors may be suitable for a display panel including pixels implemented with NMOS oxide transistors. In a case where all transistors T1 through T10 included in a stage 100 are the NMOS transistors or the NMOS oxide transistors, the gate on voltage VON may be a high gate voltage, and the first and second gate off voltages VOFF1 and VOFF2 may be first and second low gate voltages. In other embodiments, all transistors T1 through T10 included in a stage 100 may be p-type metal oxide semiconductor (PMOS) transistors, the gate on voltage VON may be a low gate voltage, and the first and second gate off voltages VOFF1 and VOFF2 may be first and second high gate voltages. Hereinafter, an example where the gate on voltage VON is the high gate voltage and the first and second gate off voltages VOFF1 and VOFF2 are the first and second low gate voltages will be described below.

Further, while the voltage of the second node N2 is the gate on voltage VON, the fifth transistor T5 and the seventh transistor T7 may output the first gate off voltage VOFF1 and the second gate off voltage VOFF2 as the scan signal SS[N] and the carry signal CR[N], respectively, and the first node N1 may have the second gate off voltage VOFF2 by the first node control block 190. Further, in some embodiments, the second gate off voltage VOFF2, or the second low gate voltage, may be lower than the first gate off voltage VOFF1, or the first low gate voltage. In this case, where the first gate off voltage VOFF1 is output as the scan signal SS[N], a gate-source voltage of the fourth transistor T4, or a voltage where a voltage of the scan output node NSSO is subtracted from the voltage of the first node N1, may be a negative voltage. For example, where the first gate off voltage VOFF1 is output as the scan signal SS[N], the gate-source voltage of the fourth transistor T4 may correspond to a voltage where the first gate off voltage VOFF1 is subtracted from the second gate off voltage VOFF2, or a voltage where the first low gate voltage is subtracted from the second low gate voltage.

In a case where the fourth transistor T4 has a zero gate-source voltage, or a positive gate-source voltage, while the first gate off voltage VOFF1 is output as the scan signal SS[N], a leakage current may flow through the fourth transistor T4, and the scan signal SS[N] may have a ripple due to the leakage current. For example, in a case where a threshold voltage of the fourth transistor T4 is shifted in a negative direction, the leakage current through fourth transistor T4 may be increased, and the ripple of the scan signal SS[N] may be increased. However, as described above, in a stage 100 of the scan driver, according to one or more embodiments, while the first gate off voltage VOFF1 is output as the scan signal SS[N], the fourth transistor T4 may have, as the gate-source voltage, the first gate off voltage VOFF1 (or the first low gate voltage) subtracted from the second gate off voltage VOFF2 (or the second low gate voltage), or the negative voltage. Accordingly, even if the threshold voltage of the fourth transistor T4 is shifted, the leakage current through fourth transistor T4 may be prevented or reduced, and the ripple of the scan signal SS[N] may be prevented or reduced.

Hereinafter, an example of an operation of the stage 100 will be described below with reference to FIGS. 1 through 9.

Figure 2:
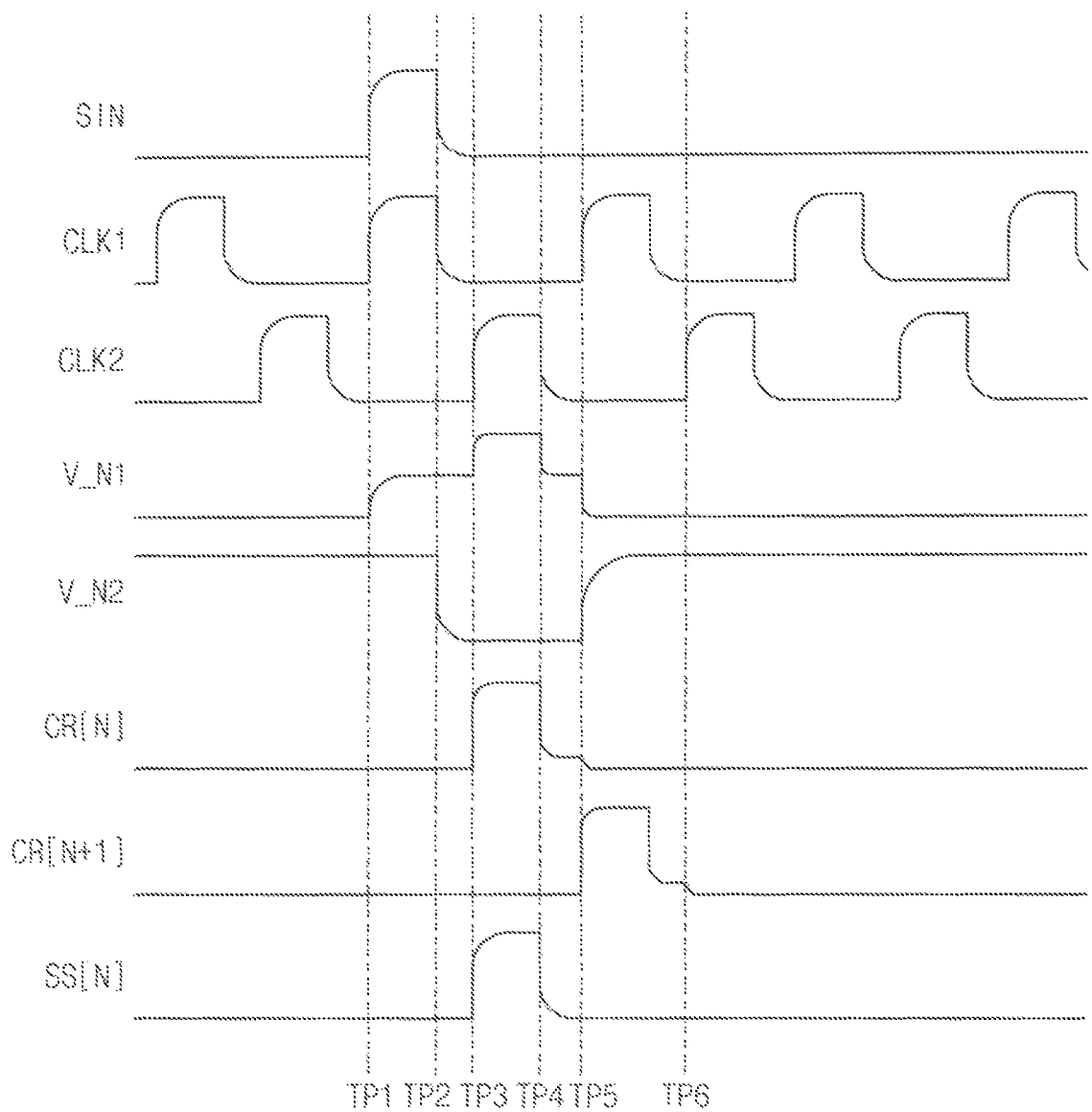
FIG. 2 is a timing diagram for describing an example of an operation of a stage of FIG. 1.
Figure 3:
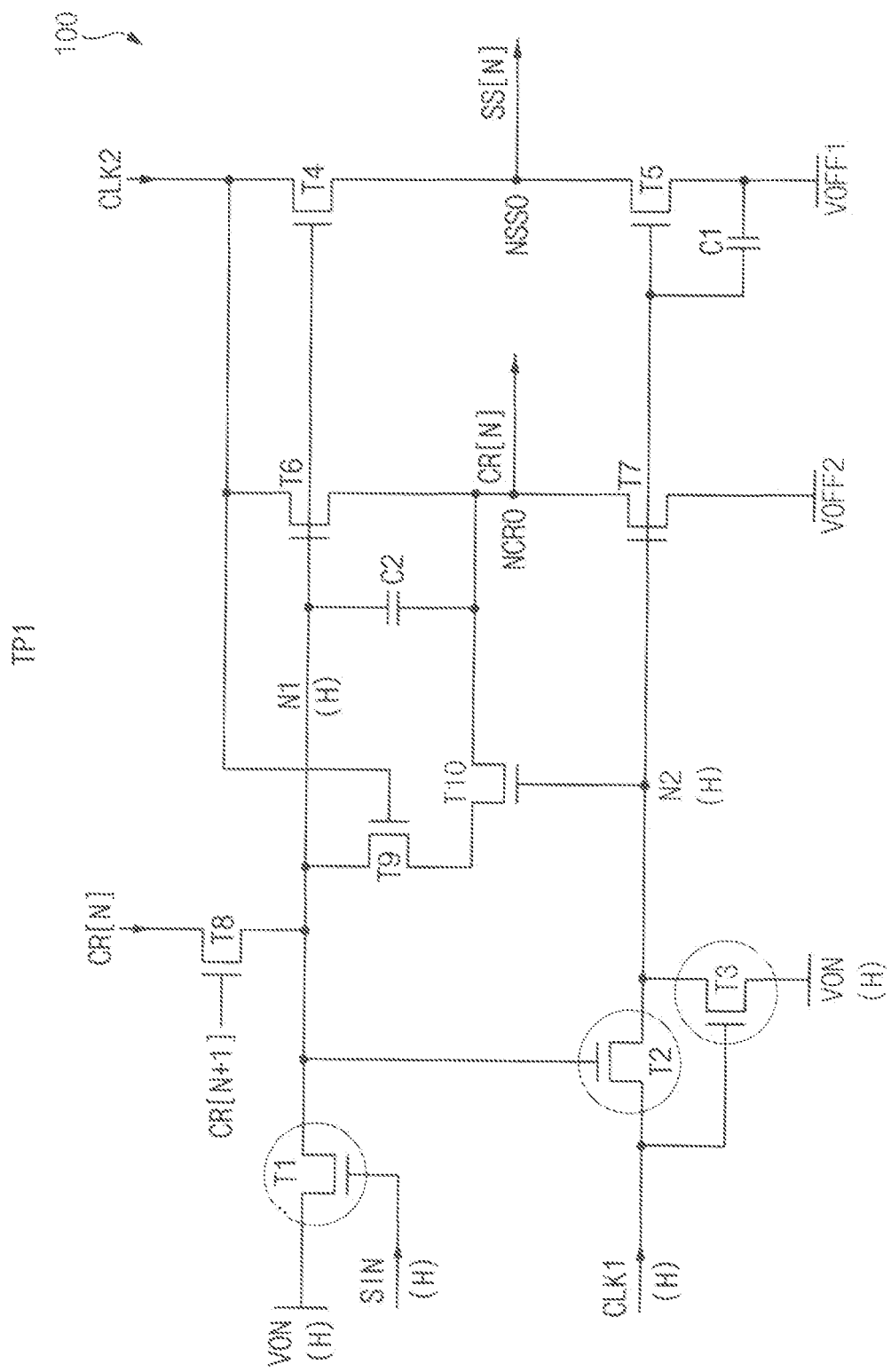
FIG. 3 is a circuit diagram for describing an example of an operation of a stage of FIG. 1 in a first time period.
Figure 4:
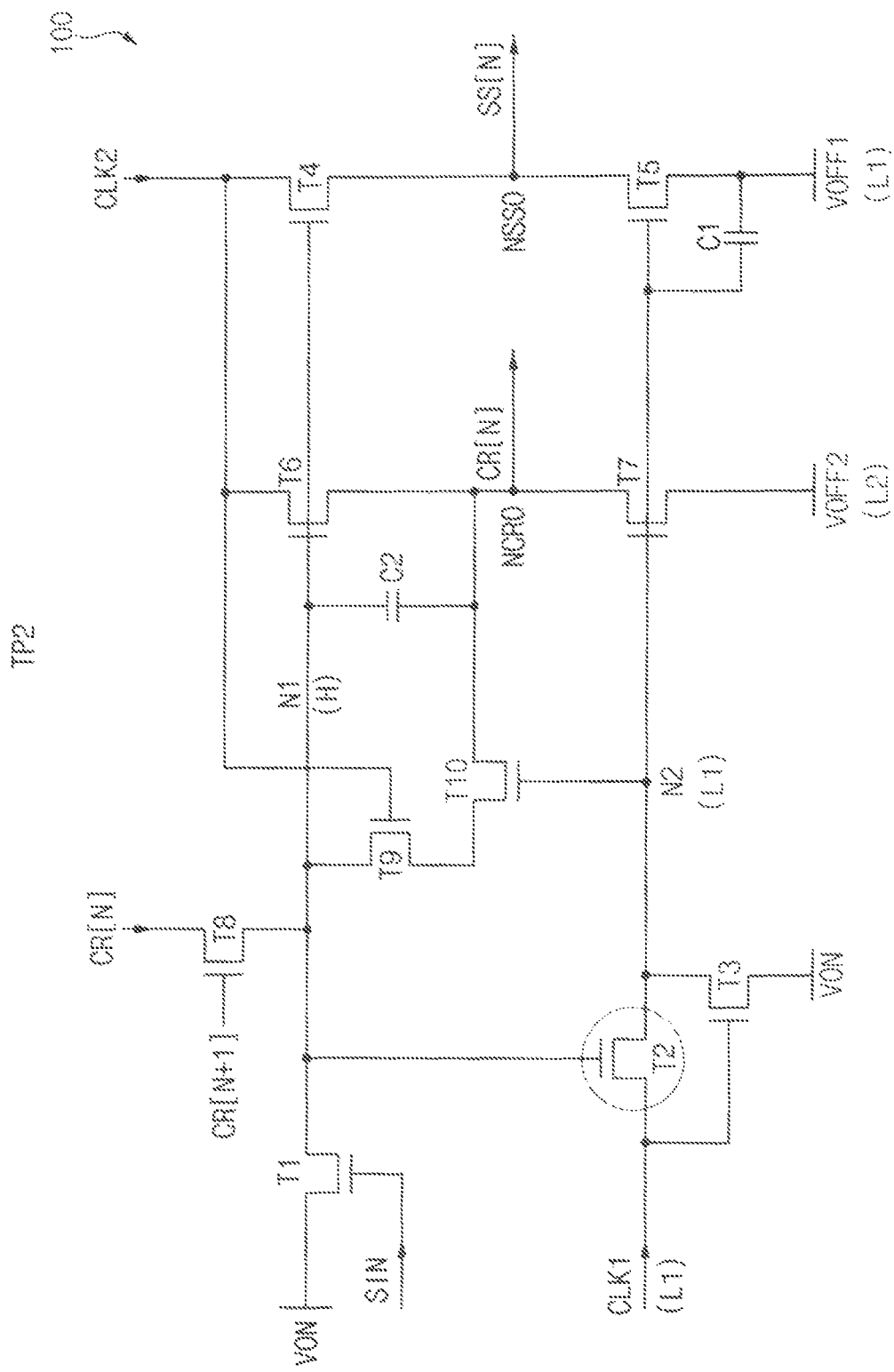
FIG. 4 is a circuit diagram for describing an example of an operation of a stage of FIG. 1 in a second time period.
Figure 5:
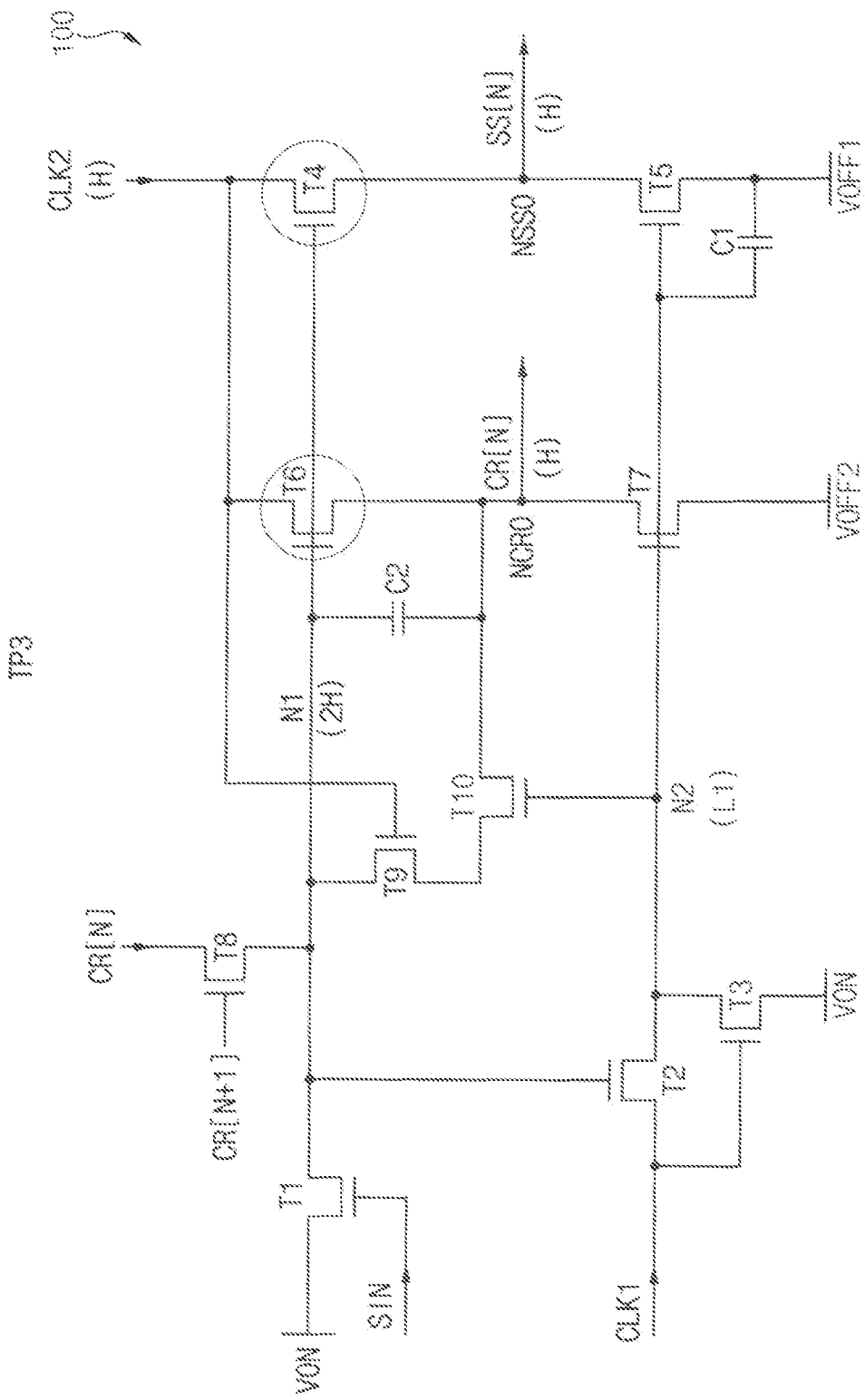
FIG. 5 is a circuit diagram for describing an example of an operation of a stage of FIG. 1 in a third time period.
Figure 6:
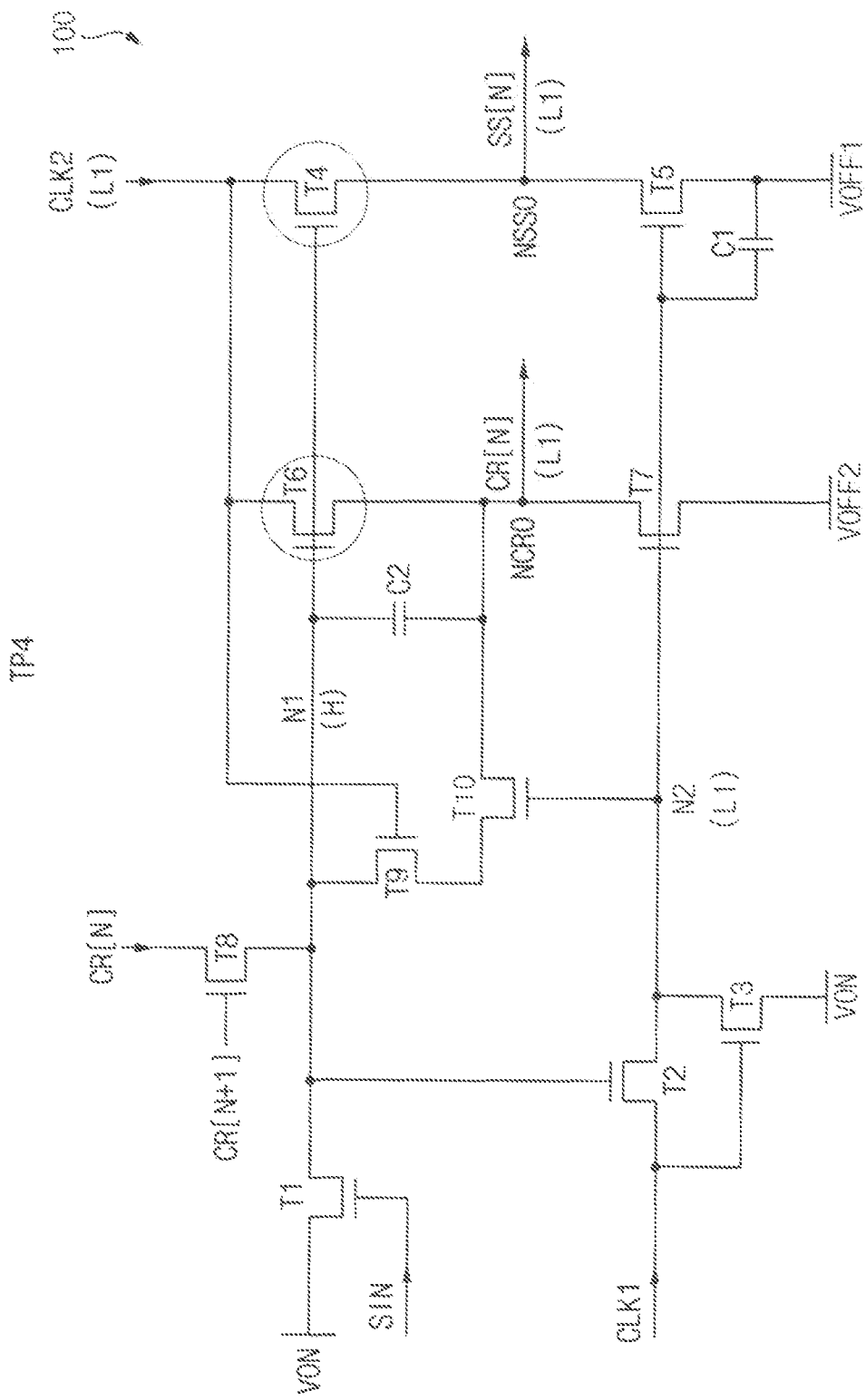
FIG. 6 is a circuit diagram for describing an example of an operation of a stage of FIG. 1 in a fourth time period.
Figure 7:
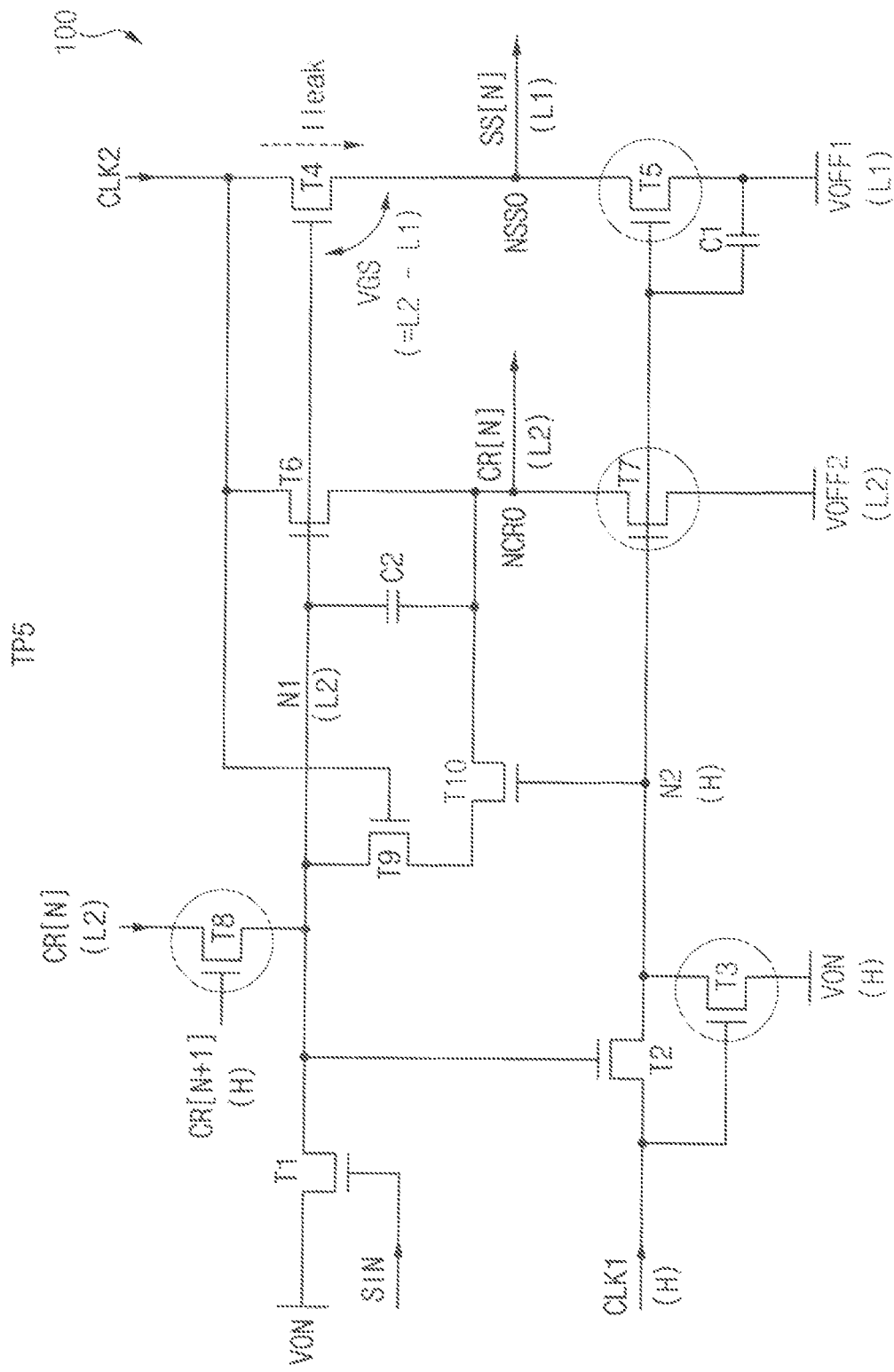
FIG. 7 is a circuit diagram for describing an example of an operation of a stage of FIG. 1 in a fifth time period.
Figure 8:
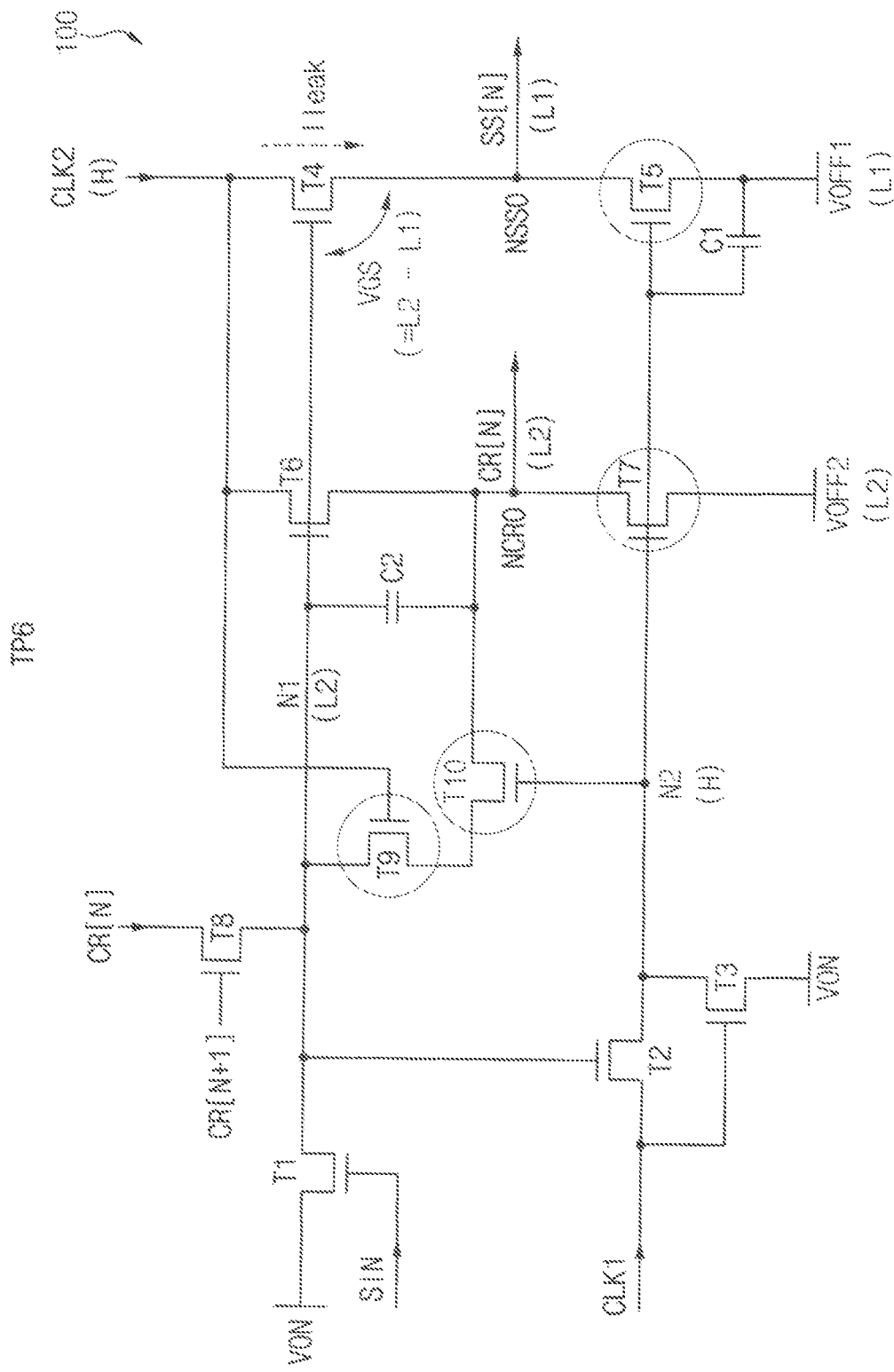
FIG. 8 is a circuit diagram for describing an example of an operation of a stage of FIG. 1 in a sixth time period.
Figure 9:
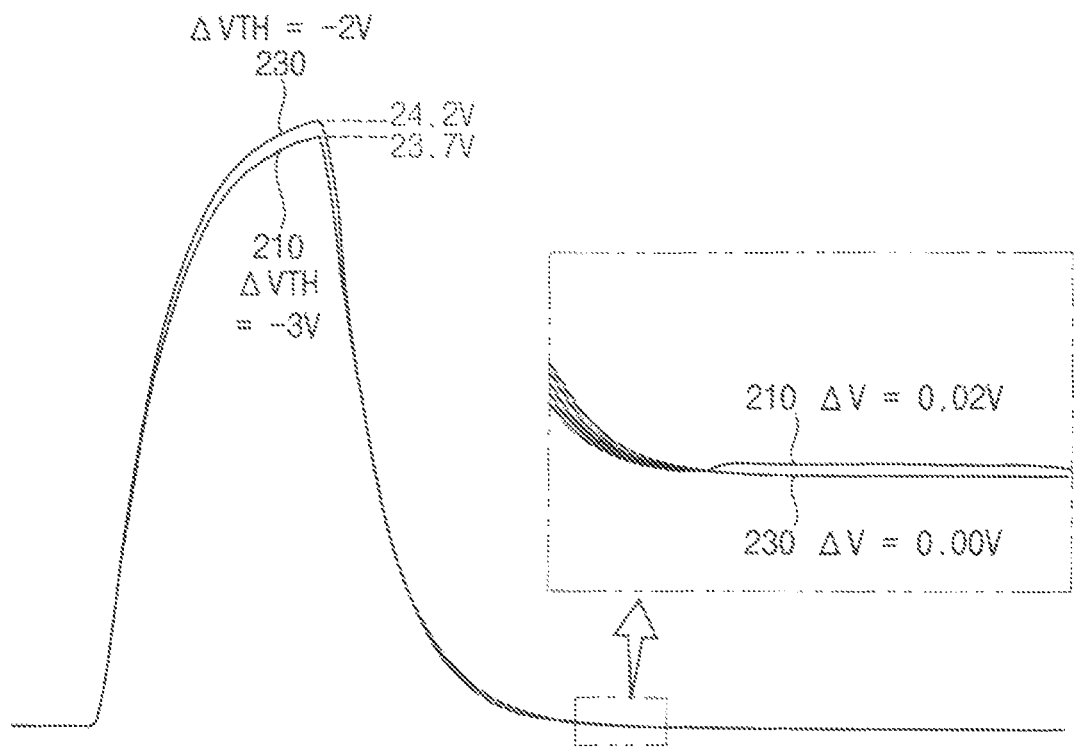
FIG. 9 is a diagram illustrating examples of scan signals in cases where each stage has different threshold voltage change amounts.

FIG. 2 is a timing diagram for describing an example of an operation of a stage of FIG. 1, FIG. 3 is a circuit diagram for describing an example of an operation of a stage of FIG. 1 in a first time period, FIG. 4 is a circuit diagram for describing an example of an operation of a stage of FIG. 1 in a second time period, FIG. 5 is a circuit diagram for describing an example of an operation of a stage of FIG. 1 in a third time period, FIG. 6 is a circuit diagram for describing an example of an operation of a stage of FIG. 1 in a fourth time period, FIG. 7 is a circuit diagram for describing an example of an operation of a stage of FIG. 1 in a fifth time period, FIG. 8 is a circuit diagram for describing an example of an operation of a stage of FIG. 1 in a sixth time period, and FIG. 9 is a diagram illustrating examples of scan signals in cases where a stage has different threshold voltage change amounts.

Referring to FIGS. 1 and 2, a stage 100 may receive an input signal SIN, a first clock signal CLK1 and a second clock signal CLK2. The input signal SIN may be a scan start signal FLM or a previous stage carry signal CR[N−1]. The first and second clock signals CLK1 and CLK2 may have different phases (e.g., opposite phases as each other). In some embodiments, each of the first and second clock signals CLK1 and CLK2 may have a gate on voltage VON as an on level (e.g., a high level), and may have a first gate off voltage VOFF1 as an off level (e.g., a low level). Further, as illustrated in FIG. 2, with respect to each of the first and second clock signals CLK1 and CLK2, an on period (e.g., a high period) may be shorter than an off period (e.g., a low period). In other embodiments, the on period may be longer than, or equal to, the off period. FIGS. 1 through 9 illustrates an example where the gate on voltage VON is a high gate voltage, and the first and second off voltages VOFF1 and VOFF2 are first and second low gate voltages.

In a first time period TP1, as illustrated in FIGS. 2 and 3, the input signal SIN having a high level H (e.g., a level of the gate on voltage VON) may be applied, and the first clock signal CLK1 may be changed to a high level H. A first transistor T1 may be turned on in response to the input signal SIN having the high level H, and may transfer the gate on voltage VON having the high level H to a first node N1. A second transistor T2 may be turned on in response to a voltage V_N1 of the first node N1 having the high level H, and may transfer the first clock signal CLK1 having the high level H to a second node N2. Further, a third transistor T3 may be turned on in response to the first clock signal CLK1 having the high level H, and may transfer the gate on voltage VON having the high level H to the second node N2. Thus, a voltage V_N2 of the second node N2 may have the high level H.

Further, in the first time period TP1, a fourth transistor T4 may be turned on in response to the voltage V_N1 of the first node N1 having the high level H, and may transfer the second clock signal CLK2 having a first low level L1 (e.g., a level of the first gate off voltage VOFF1) to a scan output node NSSO. A fifth transistor T5 may be turned on in response to the voltage V_N2 of the second node N2 having the high level H, and may transfer the first gate off voltage VOFF1 having the first low level L1 to the scan output node NSSO. Thus, a voltage of the scan output node NSSO, or a scan signal SS[N] may have the first low level L1.

Further, in the first time period TP1, a sixth transistor T6 may be turned on in response to the voltage V_N1 of the first node N1 having the high level H, and may transfer the second clock signal CLK2 having the first low level L1 to a carry output node NCRO. A seventh transistor T7 may be turned on in response to the voltage V_N2 of the second node N2 having the high level H, and may transfer the second gate off voltage VOFF2 having a second low level L2 to the carry output node NCRO. Thus, a voltage of the carry output node NCRO, or a carry signal CR[N] may have a low level between the first low level L1 and the second low level L2. In some embodiments, the second low level L2 of the second gate off voltage VOFF2 may be lower than the first low level L1 of the first gate off voltage VOFF1, and the low level of the carry signal CR[N] may be higher than the first low level L1 and lower than the second low level L2. For example, the first low level L1 may be, but not be limited to, about −6V, the second low level L2 may be, but not be limited to, about −9V, and the low level of the carry signal CR[N] may be, but not be limited to, about −7.5V.

In a second time period TP2, as illustrated in FIGS. 2 and 4, the voltage V_N1 of the first node N1 may be maintained as the high level H, and the first clock signal CLK1 may be changed to the first low level L1. The second transistor T2 may be turned on in response to the voltage V_N1 of the first node N1 having the high level H, and may transfer the first clock signal CLK1 having the first low level L1 to the second node N2. Thus, the voltage V_N2 of the second node N2 may be changed to the first low level L1. Further, the sixth transistor T6 may transfer the second clock signal CLK2 having the first low level L1 to the carry output node NCRO, the seventh transistor T7 may be turned off in response to the voltage V_N2 of the second node N2 having the first low level L1, and thus the voltage of the carry output node NCRO, or the carry signal CR[N] may have the first low level L1.

In a third time period TP3, as illustrated in FIGS. 2 and 5, the voltage V_N2 of the second node N2 may be maintained as the first low level L1, and the second clock signal CLK2 may be changed to the high level H. If the second clock signal CLK2 is changed to the high level H, the sixth transistor T6 may transfer the second clock signal CLK2 having the high level H to the carry output node NCRO, or a second electrode of a second capacitor C2, and a voltage of the second electrode of the second capacitor C2 may be changed from the first low level L1 to the high level H. One terminal of a ninth transistor T9 may have the high level H, the ninth transistor T9 may have a gate-source voltage of about 0V, and thus the ninth transistor T9 may be turned off. Further, a tenth transistor T10 may be turned off in response to the voltage V_N2 of the second node N2 having the first low level L1, and thus the first node N1, or a first electrode of the second capacitor C2 may be floated. If the voltage of the second electrode of the second capacitor C2 is changed from the first low level L1 to the high level H, and the first electrode of the second capacitor C2 is floated, the voltage of the second electrode of the second capacitor C2 may be increased or boosted from the high level H to a boosted high level 2H. Thus, the voltage V_N1 of the first node N1 may have the boosted high level 2H by the second capacitor C2 that is a boosting capacitor. The fourth transistor T4 may output the second clock signal CLK2 having the high level H as the scan signal SS[N] at the scan output node NSSO in response to the voltage V_N1 of the first node N1 having the boosted high level 2H, and the sixth transistor T6 may output the second clock signal CLK2 having the high level H as the carry signal CR[N] at the carry output node NCRO in response to the voltage V_N1 of the first node N1 having the boosted high level 2H.

In a fourth time period TP4, as illustrated in FIGS. 2 and 6, the voltage V_N2 of the second node N2 may be maintained as the first low level L1, and the second clock signal CLK2 may be changed to the first low level L1. Turn-on states of the fourth and sixth transistors T4 and T6 may be maintained in the fourth time period TP4, the fourth transistor T4 may output the second clock signal CLK2 having the first low level L1 as the scan signal SS[N] at the scan output node NSSO, and the sixth transistor T6 may output the second clock signal CLK2 having the first low level L1 as the carry signal CR[N] at the carry output node NCRO. If the voltage of the carry output node NCRO, or the voltage of the second electrode of the second capacitor C2 becomes the first low level L1, a voltage of the first electrode of the second capacitor C2, or the voltage V_N1 of the first node N1 may be decreased to the high level H such that a voltage between the first and second electrodes of the second capacitor C2 may be maintained.

In a fifth time period TP5, as illustrated in FIGS. 2 and 7, the first clock signal CLK1 may be changed to the high level H, and a next stage carry signal CR[N+1] having the high level H may be applied. The third transistor T3 may be turned on in response to the first clock signal CLK1 having the high level H, and may transfer the gate on voltage VON having the high level H to the second node N2. Thus, the voltage V_N2 of the second node N2 may have the high level H. The fifth transistor T5 may output the first gate off voltage VOFF1 having the first low level L1 as the scan signal SS[N] at the scan output node NSSO in response to the voltage V_N2 of the second node N2 having the high level H, and the seventh transistor T7 may output the second gate off voltage VOFF2 having the second low level L2 as the carry signal CR[N] at the carry output node NCRO in response to the voltage V_N2 of the second node N2 having the high level H. Thus, the scan signal SS[N] may have the first low level L1 of the first gate off voltage VOFF1, and the carry signal CR[N] may have the second low level L2 of the second gate off voltage VOFF2. In some embodiments, the second low level L2 of the second gate off voltage VOFF2 may be lower than the first low level L1 of the first gate off voltage VOFF1.

Further, an eighth transistor T8 may be turned on in response to the next stage carry signal CR[N+1] having the high level H, and may transfer the carry signal CR[N] having the second low level L2 to the first node N1. Thus, the voltage V_N1 of the first node N1 may be changed to the second low level L2. Further, because the first gate off voltage VOFF1 having the first low level L1 is applied by the fifth transistor T5 to the scan output node NSSO coupled to a second terminal (e.g., a source) of the fourth transistor T4, a voltage of the second terminal of the fourth transistor T4 may be maintained as the first low level L1. Accordingly, the voltage V_N1 of the first node N1 having the second low level L2 may be applied to a gate of the fourth transistor T4, the first gate off voltage VOFF1 having the first low level L1 may be applied to the second terminal (e.g., the source) of the fourth transistor T4, and thus a gate-source voltage VGS of the fourth transistor T4 may be a voltage L2-L1 where the first gate off voltage VOFF1 having the first low level L1 is subtracted from the second gate off voltage VOFF2 having the second low level L2. Further, because the second low level L2 is lower than the first low level L1, the gate-source voltage VGS of the fourth transistor T4 may be a negative voltage L2-L1. Accordingly, a leakage current Ileak of the fourth transistor T4 may be prevented or reduced, and a ripple in the scan signal SS[N] having the first low level L1 may be prevented or reduced.

The voltage V_N1 of the first node N1 may be maintained as the second low level L2 of the second gate off voltage VOFF2 until the scan signal SS[N] having the high level H is output in a next frame period. In some embodiments, to maintain the voltage V_N1 of the first node N1 as the second low level L2, the ninth and tenth transistors T9 and T10 may periodically apply the second gate off voltage VOFF2 having the second low level L2 to the first node N1 in response to the second clock signal CLK2 having the high level H. For example, as illustrated in FIGS. 2 and 8, in a sixth time period TP6 in which the second clock signal CLK2 has the high level H, the ninth transistor T9 may be turned on in response to the second clock signal CLK2 having the high level H, and the tenth transistor T10 may be turned on in response to the voltage V_N2 of the second node N2 having the high level H. The turned-on ninth and tenth transistors T9 and T10 may couple the carry output node NCRO to the first node N1, and may transfer the carry signal CR[N] having the second low level L2 to the carry output node NCRO. Accordingly, the voltage V_N1 of the first node N1 may be maintained as the second low level L2, the gate-source voltage VGS of the fourth transistor T4 may be maintained as the negative voltage L2-L1, the leakage current Ileak of the fourth transistor T4 may be prevented or reduced, and the ripple in the scan signal SS[N] having the first low level L1 may be prevented or reduced.

FIG. 9 illustrates an example where the voltage L2-L1 where the first gate off voltage VOFF1 having the first low level L1 is subtracted from the second gate off voltage VOFF2 having the second low level L2 is about −2V. Further, in FIG. 9, a scan signal 210 in a first case where a threshold voltage of each transistor T1 through T10 (e.g., the fourth transistor T4) of the stage 100 is shifted by a threshold voltage shift amount ΔVTH of about −3V and a scan signal 230 in a second case where a threshold voltage of each transistor T1 through T10 of the stage 100 is shifted by a threshold voltage shift amount ΔVTH of about −2V are illustrated. In the first case where the threshold voltage of each transistor T1 through T10 is shifted by the threshold voltage shift amount ΔVTH of about −3V, the high level H of the scan signal 210 may be a voltage level (e.g., about 23.7V) that is lower than a desired voltage level (e.g., about 24.2V). For example, in the first case, the scan signal 210 having the first low level L1 may have a ripple corresponding to a voltage ΔV of about 0.02V. However, as illustrated in FIG. 9, because the voltage L2-L1 where the first gate off voltage VOFF1 is subtracted from the second gate off voltage VOFF2 is about −2V, even if the threshold voltage of each transistor T1 through T10 is shifted by up to the threshold voltage shift amount ΔVTH of about −2V as in the second case, the high level H of the scan signal 230 may be the desired voltage level (e.g., about 24.2V). Further, the scan signal 230 having the first low level L1 may be increased by a voltage ΔV of about 0.00V, or may have no ripple. Accordingly, in a case where the second gate off voltage VOFF2 is substantially the same as the first gate off voltage VOFF1, a ripple may occur in the scan signal SS[N] if the threshold voltage of each transistor T1 through T10 is shifted in a negative direction. However, in a case where the voltage L2-L1 where the first gate off voltage VOFF1 is subtracted from the second gate off voltage VOFF2 is about −2V in the stage 100, according to one or more embodiments, no ripple may occur in the scan signal SS[N] even if the threshold voltage of each transistor T1 through T10 of the stage 100 is shifted by up to the threshold voltage shift amount ΔVTH of about −2V. Thus, in the stage 100 according to one or more embodiments, a threshold voltage margin of each transistor T1 through T10 may be improved, and no ripple may occur in the scan signal SS[N].

Figure 10:
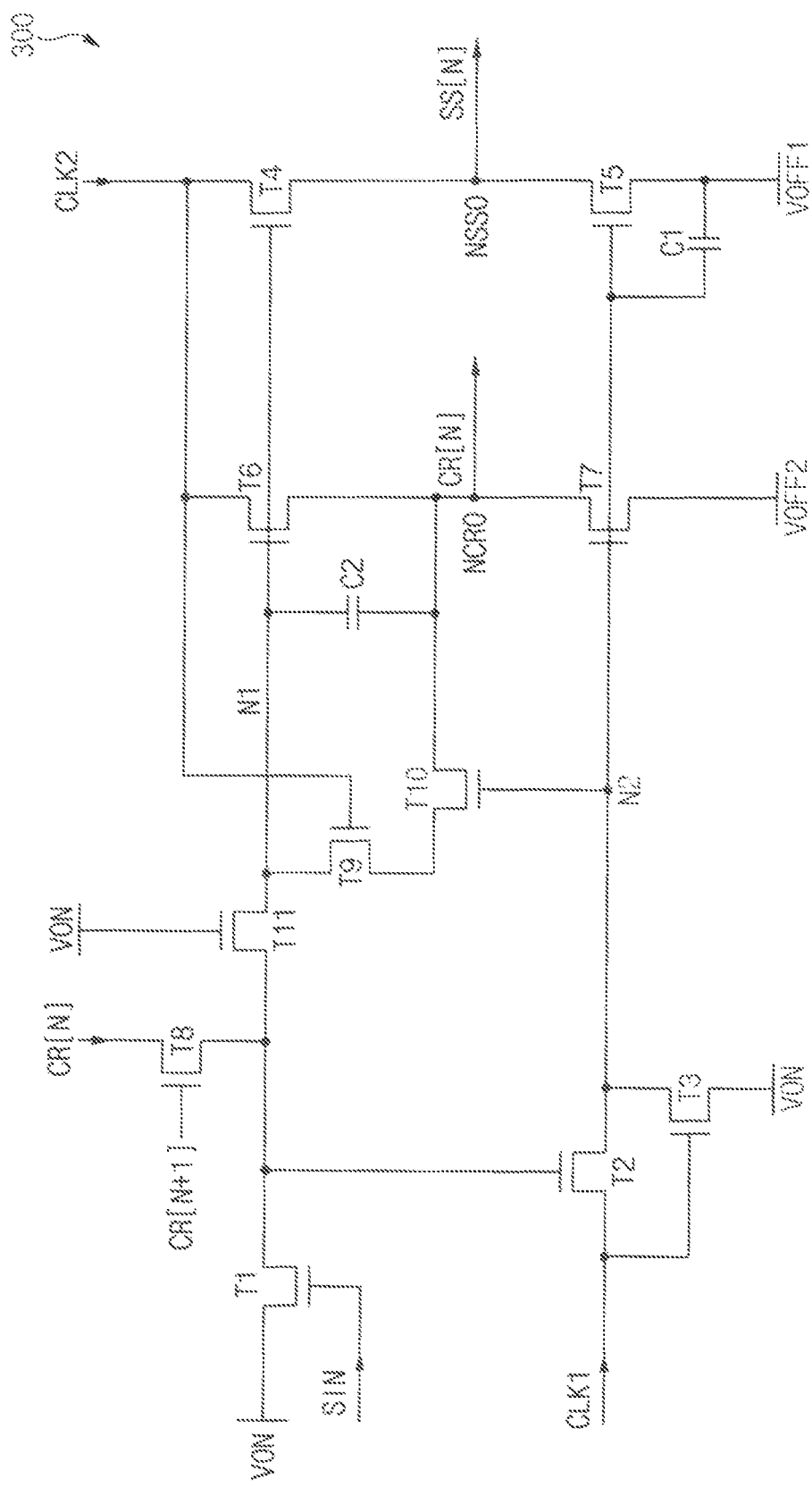
FIG. 10 is a circuit diagram illustrating a stage included in a scan driver according to one or more embodiments.

FIG. 10 is a circuit diagram illustrating a stage included in a scan driver according to one or more embodiments.

Referring to FIG. 10, a stage 300 may include a first capacitor C1, a second capacitor C2, a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, and an eleventh transistor T11. The stage 300 of FIG. 10 may have a similar configuration and a similar operation to a stage 100 of FIG. 1, except that the stage 300 may further include the eleventh transistor T11 located at a first node N1.

The eleventh transistor T11 may be located at the first node N1, and may include a gate for receiving a gate on voltage VON. The eleventh transistor T11 may prevent or reduce a voltage of the first node N1 boosted by the second capacitor C2 from being transferred to other transistors, for example the first and eighth transistors T1 and T8, and thus stresses to the first and eighth transistors T1 and T8 may be relieved or relaxed. Thus, the eleventh transistor T11 may be referred to as a stress relieving transistor or a stress relaxing transistor. In some embodiments, as illustrated in FIG. 10, the eleventh transistor T11 may include a gate for receiving the gate on voltage VON, a first terminal coupled to a second terminal of the first transistor T1 and to a second terminal of the eighth transistor T8, and a second terminal coupled to a first terminal of the ninth transistor T9 and to a first electrode of the second capacitor C2.

Figure 11:
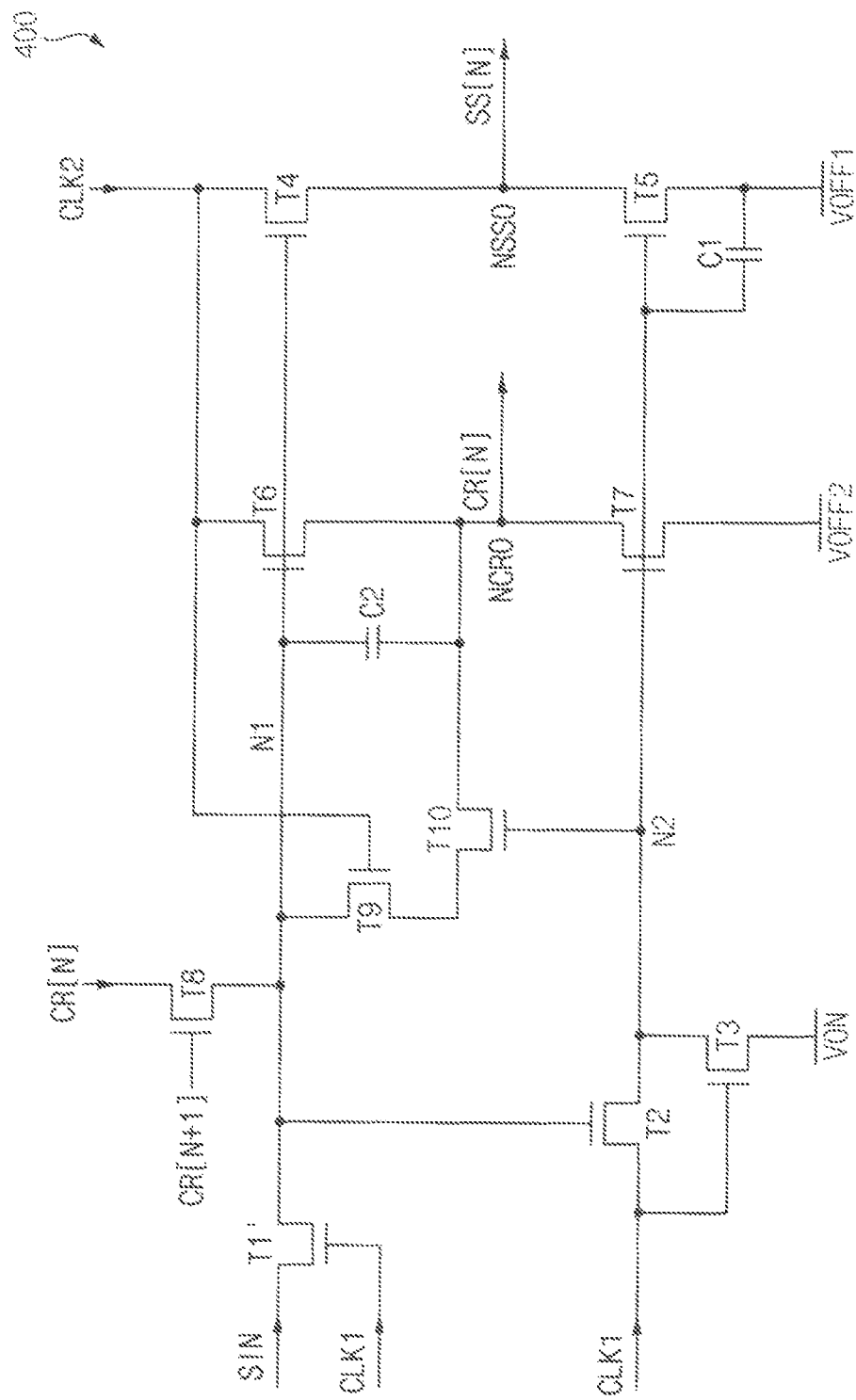
FIG. 11 is a circuit diagram illustrating a stage included in a scan driver according to one or more embodiments.

FIG. 11 is a circuit diagram illustrating a stage included in a scan driver according to one or more embodiments.

Referring to FIG. 11, a stage 400 may include a first capacitor C1, a second capacitor C2, a first transistor T1', a second transistor T2, a third transistor T3, a fourth transistor T4, a fifth transistor T5, a sixth transistor T6, a seventh transistor T7, an eighth transistor T8, a ninth transistor T9, and a tenth transistor T10. The stage 400 of FIG. 10 may have a similar configuration and a similar operation to a stage 100 of FIG. 1, except that the first transistor T1' may transfer an input signal SIN to a first node N1 in response to a first clock signal CLK1.

Unlike a first transistor T1 illustrated in FIG. 1, which transfers a gate on voltage VON to the first node N1 in response to the input signal SIN, the first transistor T1' may transfer the input signal SIN having an on level (e.g., a high level) to the first node N1 in response to the first clock signal CLK1 having the on level (e.g., the high level). In some embodiments, as illustrated in FIG. 11, the first transistor T1' may include a gate for receiving the first clock signal CLK1, a first terminal for receiving the input signal SIN, and a second terminal coupled to the first node N1.

Figure 12:
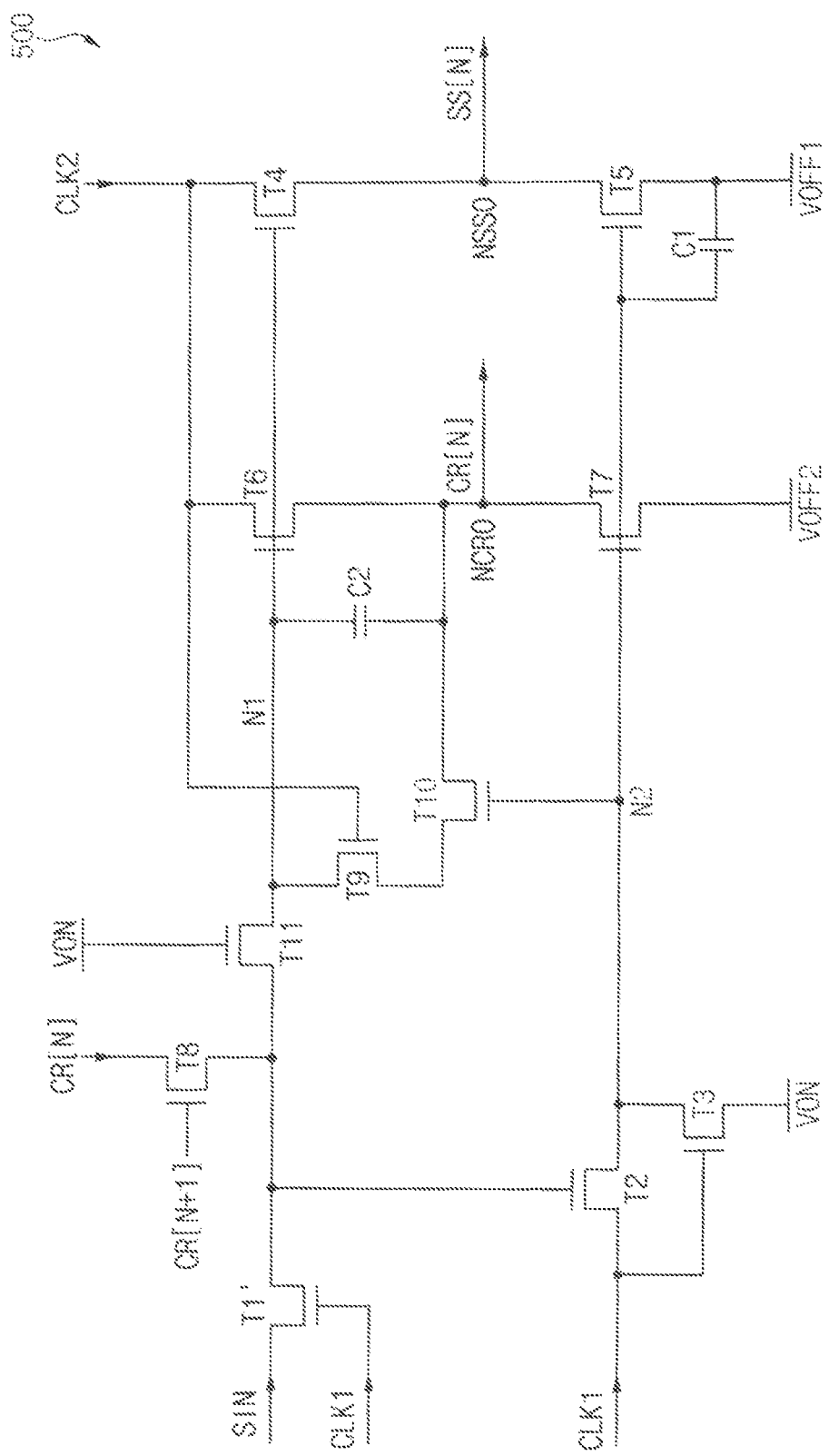
FIG. 12 is a circuit diagram illustrating a stage included in a scan driver according to one or more embodiments.

FIG. 12 is a circuit diagram illustrating a stage included in a scan driver according to one or more embodiments.

Referring to FIG. 12, a stage 500 may include a first capacitor C1, a second capacitor C2, a first transistor T1', a second transistor T2, a third transistor T3, a fourth transistor T4, a fifth transistor T5, a sixth transistor T6, a seventh transistor T7, an eighth transistor T8, a ninth transistor T9, a tenth transistor T10, and an eleventh transistor T11. The stage 500 of FIG. 12 may have a similar configuration and a similar operation to a stage 400 of FIG. 11, except that the stage 500 may further include the eleventh transistor T11 located at a first node N1.

The eleventh transistor T11 may be located at the first node N1, and may include a gate for receiving a gate on voltage VON. The eleventh transistor T11 may prevent or reduce a voltage of the first node N1 boosted by the second capacitor C2 from being transferred to other transistors, for example the first and eighth transistors T1' and T8, and thus stresses to the first and eighth transistors T1' and T8 may be relieved or relaxed.

Thus, the eleventh transistor T11 may be referred to as a stress relieving transistor or a stress relaxing transistor. In some embodiments, as illustrated in FIG. 10, the eleventh transistor T11 may include a gate for receiving the gate on voltage VON, a first terminal coupled to a second terminal of the first transistor T1 and to a second terminal of the eighth transistor T8, and a second terminal coupled to a first terminal of the ninth transistor T9 and to a first electrode of the second capacitor C2.

Figure 13:
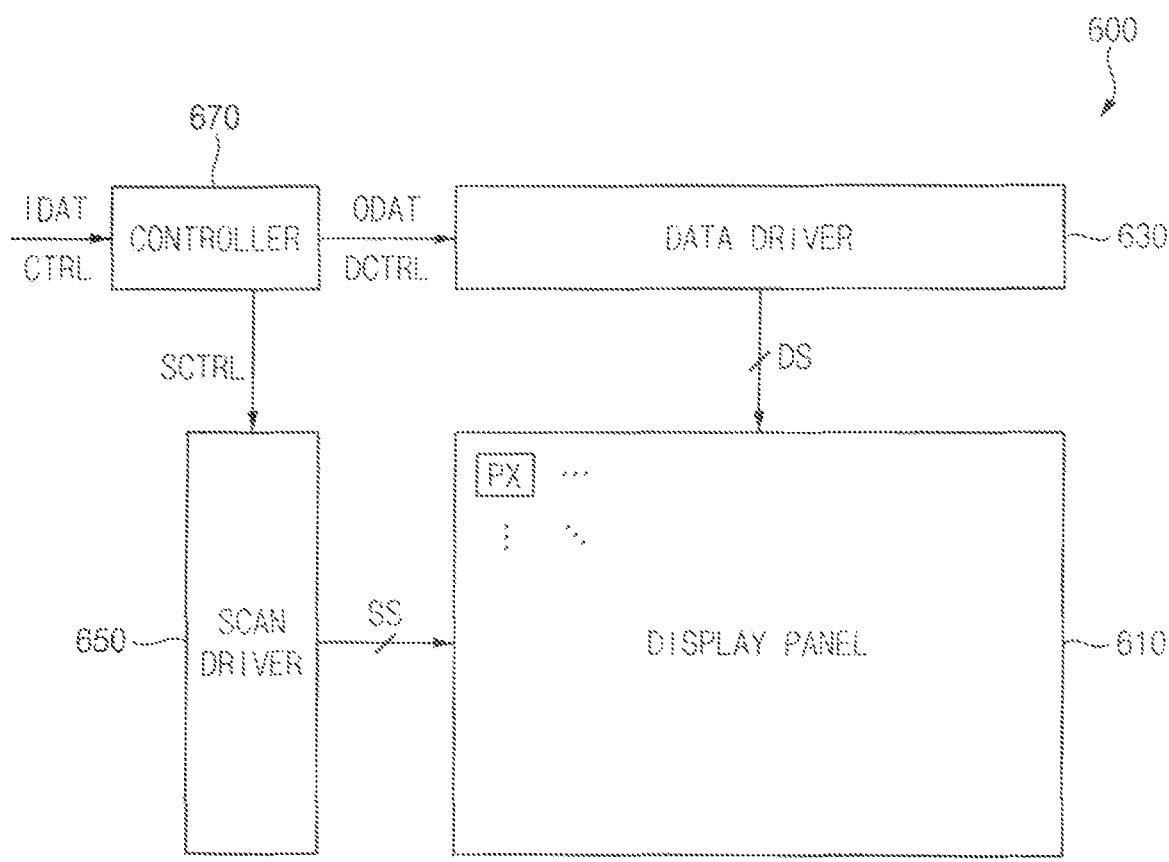
FIG. 13 is a block diagram illustrating a display device including a scan driver according to one or more embodiments.
Figure 14:
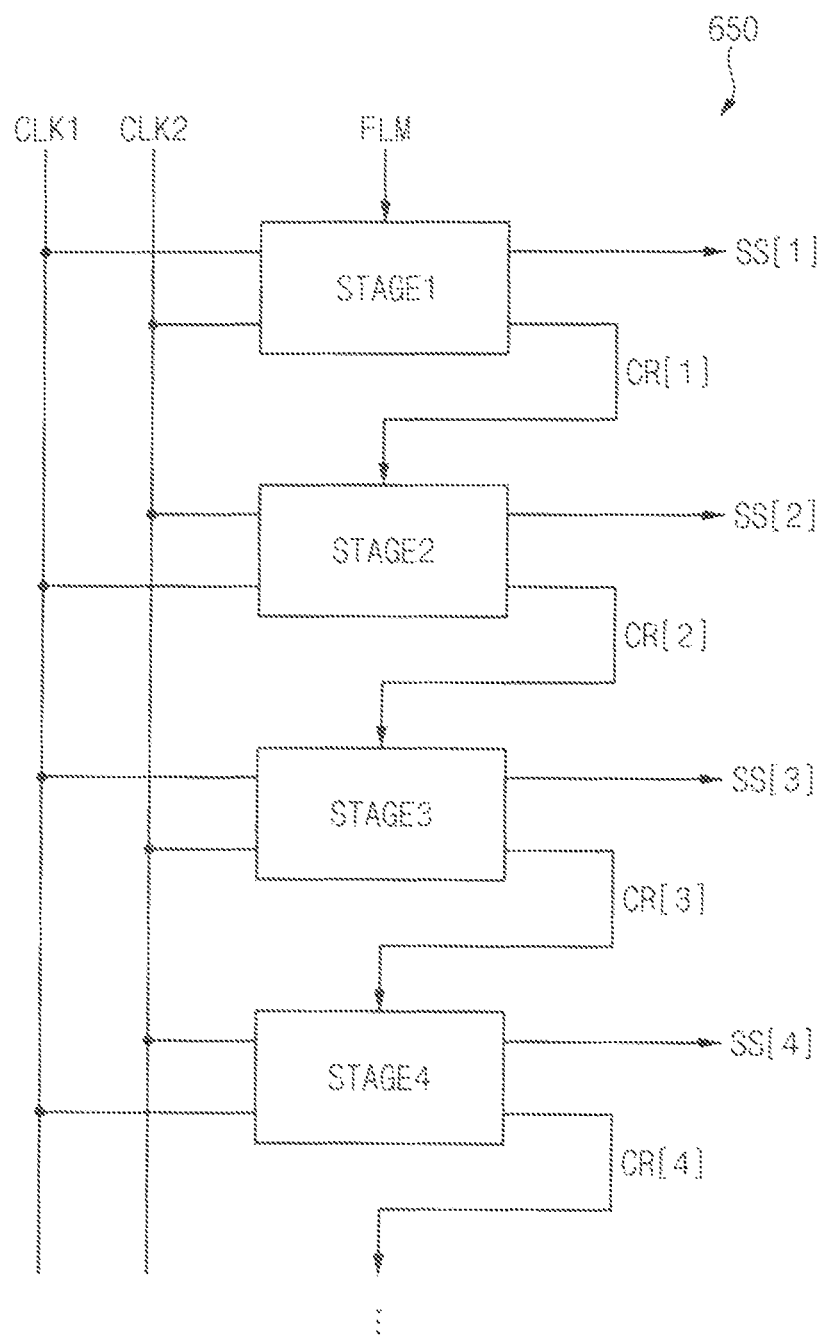
FIG. 14 is a block diagram illustrating an example of a scan driver according to one or more embodiments.
Figure 15:
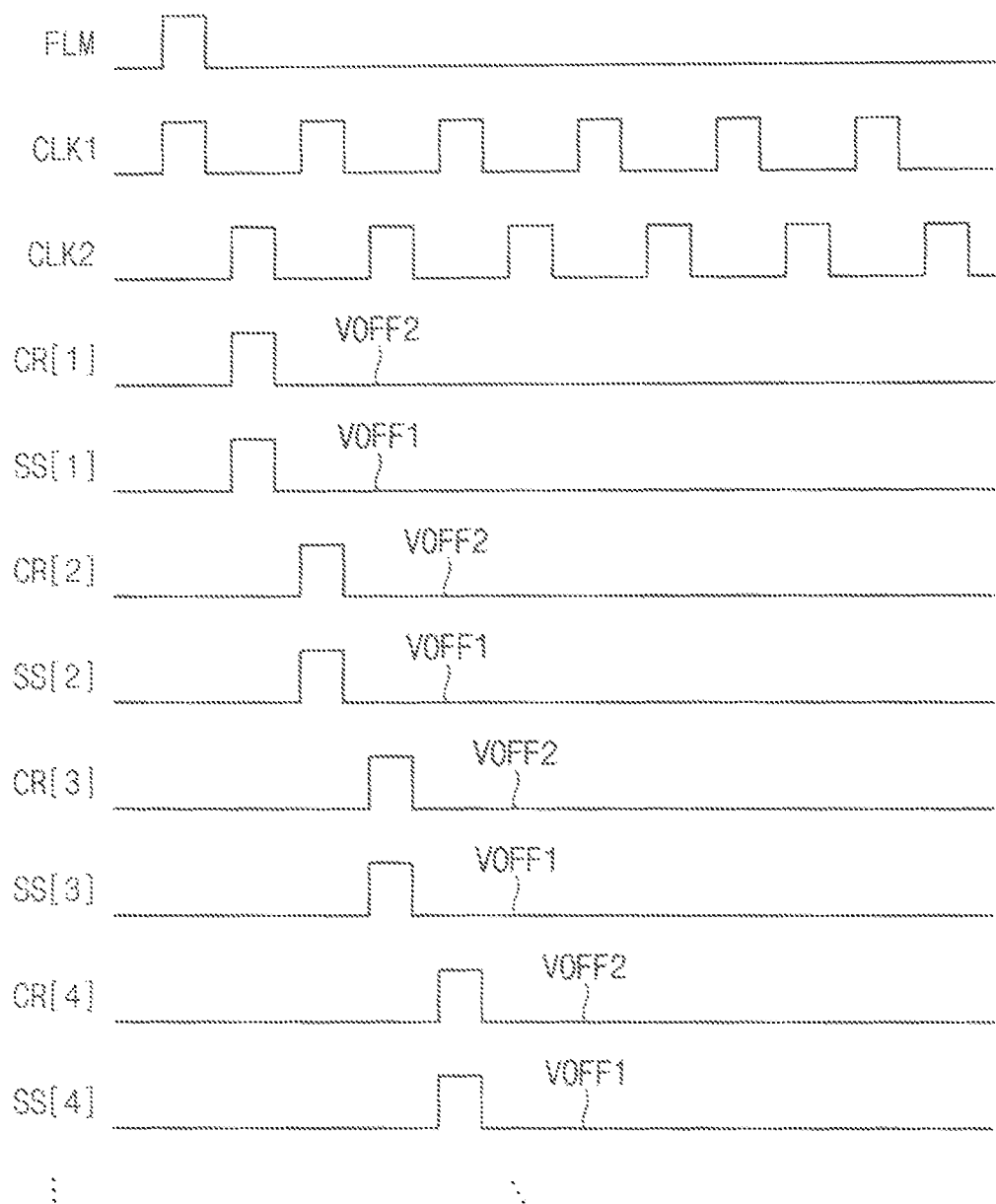
FIG. 15 is a timing diagram for describing an example of an operation of a scan driver according to one or more embodiments.

FIG. 13 is a block diagram illustrating a display device including a scan driver according to one or more embodiments, FIG. 14 is a block diagram illustrating an example of a scan driver according to one or more embodiments, and FIG. 15 is a timing diagram for describing an example of an operation of a scan driver according to one or more embodiments.

Referring to FIG. 13, a display device 600 according to one or more embodiments may include a display panel 610 that includes a plurality of pixels PX, a data driver 630 that provides data signals DS to the plurality of pixels PX, a scan driver 650 that provides scan signals SS to the plurality of pixels PX, and a controller 670 that controls the data driver 630 and the scan driver 650.

The display panel 610 may include data lines, scan lines, and the plurality of pixels PX coupled to the data lines and the scan lines. In some embodiments, each pixel PX may include at least one capacitor, at least two transistors, and a light emitting element. For example, each pixel PX may include a switching transistor that transfers the data signal DS in response to the scan signal SS, a storage capacitor that stores the data signal DS transferred by the switching transistor, a driving transistor that generates a driving current based on the data signal DS stored in the storage capacitor, and the light emitting element that emits light based on the driving current generated by the driving transistor. In some embodiments, the light emitting element may be any suitable light emitting element, such as an organic light emitting diode (OLED), a nano light emitting diode (NED), a quantum dot (QD) light emitting element, a micro light emitting element, an inorganic light emitting element, etc. In some embodiments, all transistors of each pixel PX may be NMOS transistors or NMOS oxide transistors.

The data driver 630 may generate the data signals DS based on output image data ODAT and a data control signal DCTRL received from the controller 670, and may provide the data signals DS to the plurality of pixels PX through the data lines. In some embodiments, the data control signal DCTRL may include, but is not limited to, an output data enable signal, a horizontal start signal, and a load signal. In some embodiments, the data driver 630 and the controller 670 may be implemented with a single integrated circuit, and the single integrated circuit may be referred to as a timing controller embedded data driver (TED). In other embodiments, the data driver 630 and the controller 670 may be implemented with separate integrated circuits.

The scan driver 650 may generate the scan signals SS based on a scan control signal SCTRL received from the controller 670, and may provide the scan signals SS to the plurality of pixels PX through the scan lines. In some embodiments, the scan control signal SCTRL may include, but is not limited to, a scan start signal and a scan clock signal. In some embodiments, the scan driver 650 may be integrated or formed in a peripheral portion of the display panel 610. In other embodiments, the scan driver 650 may be implemented with one or more integrated circuits.

In some embodiments, as illustrated in FIG. 14, the scan driver 650 may include a plurality of stages STAGE1, STAGE2, STAGE3, STAGE4, . . . and may receive a scan start signal FLM, a first clock signal CLK1 and a second clock signal CLK2, and may output a plurality of scan signals SS[1], SS[2], SS[3], SS[4], . . . and a plurality of carry signals CR[1], CR[2], CR[3], CR[4], . . . . A first stage STAGE1 may receive the scan start signal FLM as an input signal, and subsequent stages STAGE2, STAGE3, STAGE4, . . . may receive carry signals CR1, CR2, CR3, CR4, . . . of their respective previous stages as input signals.

Each of the plurality of stages STAGE1, STAGE2, STAGE3, STAGE4, . . . may have a configuration that is substantially the same as a configuration of the stage 100 illustrated in FIG. 1, the stage 300 illustrated in FIG. 10, the stage 400 illustrated in FIG. 11, or the stage 500 illustrated in FIG. 12. Further, odd numbered stages STAGE1, STAGE3, . . . of the plurality of stages STAGE1, STAGE2, STAGE3, STAGE4, . . . may receive the input signals based on the first clock signal CLK1, and may output the scan signals SS[1], SS[3], . . . and the carry signals CR[1], CR[3], . . . based on the second clock signal CLK2. Even numbered stages STAGE2, STAGE4, . . . of the plurality of stages STAGE1, STAGE2, STAGE3, STAGE4, . . . may receive the input signals based on the second clock signal CLK2, and may output the scan signals SS[2], SS[4], . . . and the carry signals CR[2], CR[4], . . . based on the first clock signal CLK1.

For example, as illustrated in FIG. 15, the plurality of stages STAGE1, STAGE2, STAGE3, STAGE4, . . . may sequentially output the scan signals SS[1], SS[2], SS[3], SS[4], . . . and the carry signals CR[1], CR[2], CR[3], CR[4], . . . within one frame period. A first stage STAGE1 may output a first carry signal CR[1] and a first scan signal SS[1] based on the scan start signal FLM, a second stage STAGE2 may output a second carry signal CR[2] and a second scan signal SS[2] based on the first carry signal CR[1], a third stage STAGE3 may output a third carry signal CR[3] and a third scan signal SS[3] based on the second carry signal CR[2], and a fourth stage STAGE4 may output a fourth carry signal CR[4] and a fourth scan signal SS[4] based on the third carry signal CR[3]. Further, the carry signals CR[1], CR[2], CR[3], CR[4], . . . may have, as an off level, a second gate off voltage VOFF2 that is different from a first gate off voltage VOFF1 of the scan signals SS[1], SS[2], SS[3], SS[4], . . . , and the second gate off voltage VOFF2 of the carry signals CR[1], CR[2], CR[3], CR[4], . . . may be applied to first nodes of the plurality of stages STAGE1, STAGE2, STAGE3, STAGE4, . . . . Accordingly, leakage currents of transistors of the plurality of stages STAGE1, STAGE2, STAGE3, STAGE4, . . . for outputting the scan signals SS[1], SS[2], SS[3], SS[4], . . . having an on level may be prevented or reduced, and a ripple in the scan signals SS[1], SS[2], SS[3], SS[4], . . . having an off level may be prevented or reduced.

Referring again to FIG. 13, the controller 670 (e.g., a timing controller (TCON)) may receive input image data IDAT and a control signal CTRL from an external host (e.g., an application processor (AP), a graphics processing unit (GPU) or a graphics card). In some embodiments, the control signal CTRL may include, but is not limited to, a vertical synchronization signal, a horizontal synchronization signal, an input data enable signal, a master clock signal, etc. The controller 670 may generate the output image data ODAT, the data control signal DCTRL, and the scan control signal SCTRL based on the input image data IDAT and the control signal CTRL. The controller 670 may control an operation of the data driver 630 by providing the output image data ODAT and the data control signal DCTRL to the data driver 630, and may control an operation of the scan driver 650 by providing the scan control signal SCTRL to the scan driver 650.

As described above, in the display device 600 according to one or more embodiments, the second gate off voltage VOFF2 for the carry signal may be different from the first gate off voltage VOFF1 for the scan signal SS, and the second gate off voltage VOFF2 may be applied to the first node of a stage of the scan driver 650. Accordingly, a leakage current of a transistor for outputting the scan signal SS may be reduced, a ripple may not occur in the scan signal SS, and operation reliability of the scan driver 650 may be improved.

Figure 16:
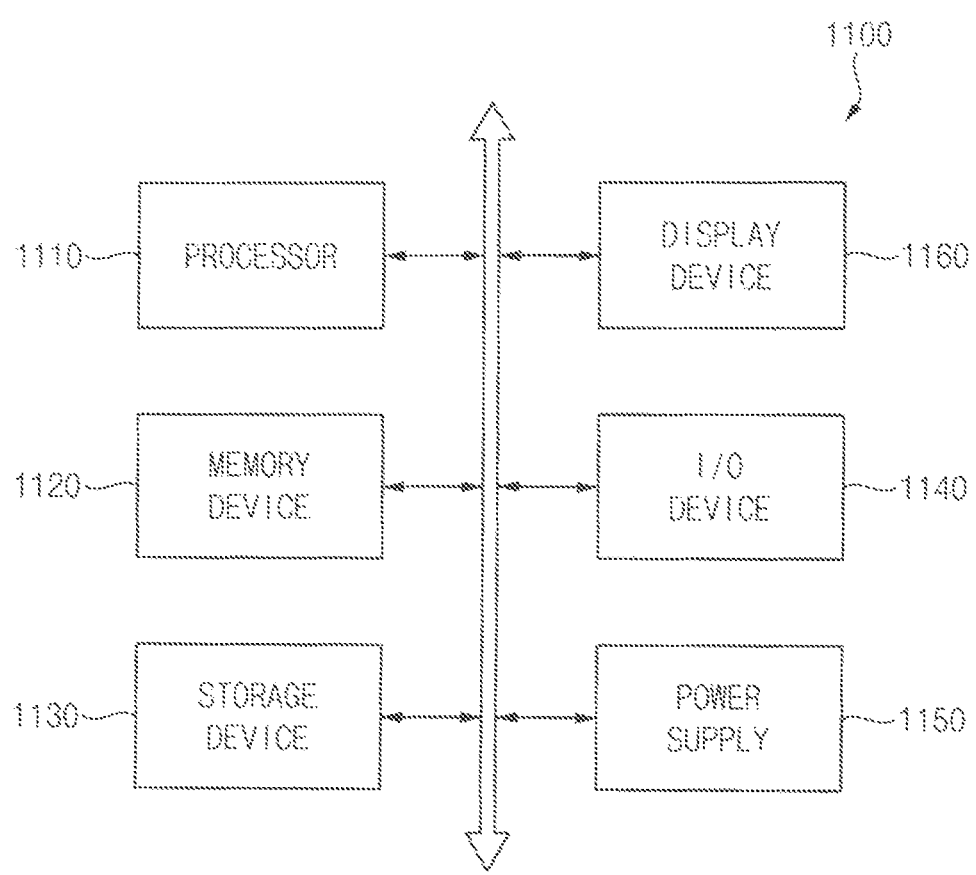
FIG. 16 is an electronic device including a display device according to one or more embodiments.

FIG. 16 is an electronic device including a display device according to one or more embodiments.

Referring to FIG. 16, an electronic device 1100 may include a processor 1110, a memory device 1120, a storage device 1130, an input/output (I/O) device 1140, a power supply 1150, and a display device 1160. The electronic device 1100 may further include a plurality of ports for communicating with a video card, a sound card, a memory card, a universal serial bus (USB) device, other electric devices, etc.

The processor 1110 may perform various computing functions or tasks. The processor 1110 may be an application processor (AP), a microprocessor, a central processing unit (CPU), etc. The processor 1110 may be coupled to other components via an address bus, a control bus, a data bus, etc. Further, in some embodiments, the processor 1110 may be further coupled to an extended bus such as a peripheral component interconnection (PCI) bus.

The memory device 1120 may store data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile dynamic random access memory (mobile DRAM) device, etc.

The storage device 1130 may be a solid state drive (SSD) device, a hard disk drive (HDD) device, a CD-ROM device, etc. The I/O device 1140 may be an input device such as a keyboard, a keypad, a mouse, a touch screen, etc., and an output device such as a printer, a speaker, etc. The power supply 1150 may supply power for operations of the electronic device 1100. The display device 1160 may be coupled to other components through the buses or other communication links.

In the display device 1160, a second low gate voltage for a carry signal may be different from a first low gate voltage for a scan signal, and the second low gate voltage may be applied to a first node of each stage. Accordingly, a leakage current of a transistor for outputting the scan signal may be reduced in each stage, a ripple may be reduced, or may not occur, in the scan signal, and operation reliability of a scan driver may be improved.

The disclosed embodiments may be applied to any display device 1160, and any electronic device 1100 including the display device 1160. For example, the disclosed embodiments may be applied to a mobile phone, a smart phone, a wearable electronic device, a tablet computer, a television (TV), a digital TV, a 3D TV, a personal computer (PC), a home appliance, a laptop computer, a personal digital assistant (PDA), a portable multimedia player (PMP), a digital camera, a music player, a portable game console, a navigation device, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, with functional equivalents thereof to be included therein.

What is claimed is:

1. A scan driver comprising stages, the stages comprising:
   an input block configured to change a voltage of a first node to a gate on voltage based on an input signal;
   a second node control block configured to control a voltage of a second node in response to a first clock signal and the voltage of the first node;
   a scan output block configured to output a second clock signal as a scan signal in response to the voltage of the first node, and to output a first gate off voltage as the scan signal in response to the voltage of the second node, wherein the scan output block comprises a first capacitor comprising a first electrode directly coupled to the second node, and a second electrode for receiving the first gate off voltage;
   a carry output block configured to output the second clock signal as a carry signal in response to the voltage of the first node, and to output a second gate off voltage that is different from the first gate off voltage as the carry signal in response to the voltage of the second node, wherein the carry output block further comprises a second capacitor comprising a first electrode directly coupled to the first node, and a second electrode directly coupled to a carry output node configured to output the carry signal; and
   a first node control block configured to transfer the carry signal to the first node in response to a next stage carry signal.

2. The scan driver of claim 1, wherein an absolute value of the second gate off voltage is greater than an absolute value of the first gate off voltage.

3. The scan driver of claim 1, wherein the stages further comprise n-type metal oxide semiconductor (NMOS) transistors,
   wherein the gate on voltage is a high gate voltage,
   wherein the first and second gate off voltages are respectively first and second low gate voltages, and
   wherein the second low gate voltage is lower than the first low gate voltage.

4. The scan driver of claim 1, wherein the input block comprises a first transistor comprising a gate for receiving the input signal, a first terminal for receiving the gate on voltage, and a second terminal coupled to the first node.

5. The scan driver of claim 1, wherein the input block comprises a first transistor comprising a gate for receiving the first clock signal, a first terminal for receiving the input signal, and a second terminal coupled to the first node.

6. The scan driver of claim 1, wherein the second node control block comprises:
   a second transistor comprising a gate coupled to the first node, a first terminal for receiving the first clock signal, and a second terminal coupled to the second node; and
   a third transistor comprising a gate for receiving the first clock signal, a first terminal coupled to the second node, and a second terminal for receiving the gate on voltage.

7. The scan driver of claim 1, wherein the scan output block comprises:
   a fourth transistor comprising a gate coupled to the first node, a first terminal for receiving the second clock signal, and a second terminal coupled to a scan output node configured to output the scan signal; and
   a fifth transistor comprising a gate coupled to the second node, a first terminal coupled to the scan output node, and a second terminal for receiving the first gate off voltage.

8. The scan driver of claim 7, wherein a gate-source voltage of the fourth transistor is a negative voltage while the first gate off voltage is output as the scan signal.

9. The scan driver of claim 7, wherein a gate-source voltage of the fourth transistor corresponds to the first gate off voltage subtracted from the second gate off voltage while the first gate off voltage is output as the scan signal.

10. The scan driver of claim 1, wherein the carry output block comprises:
    a sixth transistor comprising a gate coupled to the first node, a first terminal for receiving the second clock signal, and a second terminal coupled to the carry output node; and
    a seventh transistor comprising a gate coupled to the second node, a first terminal coupled to the carry output node, and a second terminal for receiving the second gate off voltage.

11. The scan driver of claim 1, wherein the first node control block comprises an eighth transistor comprising a gate for receiving the next stage carry signal, a first terminal for receiving the carry signal, and a second terminal coupled to the first node.

12. The scan driver of claim 11, wherein the first node control block further comprises:
    a ninth transistor comprising a gate for receiving the second clock signal, a first terminal coupled to the first node, and a second terminal; and
    a tenth transistor comprising a gate coupled to the second node, a first terminal coupled to the second terminal of the ninth transistor, and a second terminal coupled to the carry output node.

13. The scan driver of claim 12, wherein, while the voltage of the second node is the gate on voltage, the ninth and tenth transistors periodically couple the first node and the carry output node in response to the second clock signal.

14. The scan driver of claim 1, wherein the stages further comprise an eleventh transistor located at the first node, and comprising a gate for receiving the gate on voltage.

15. A scan driver comprising stages, the stages comprising:
    a first transistor comprising a gate for receiving an input signal, a first terminal for receiving a gate on voltage, and a second terminal coupled to a first node;
    a second transistor comprising a gate coupled to the first node, a first terminal for receiving a first clock signal, and a second terminal coupled to a second node;
    a third transistor comprising a gate for receiving the first clock signal, a first terminal coupled to the second node, and a second terminal for receiving the gate on voltage;
    a fourth transistor comprising a gate coupled to the first node, a first terminal for receiving a second clock signal, and a second terminal coupled to a scan output node;
    a fifth transistor comprising a gate coupled to the second node, a first terminal coupled to the scan output node, and a second terminal for receiving a first gate off voltage;
    a first capacitor comprising a first electrode directly coupled to the second node, and a second electrode for receiving the first gate off voltage;

a sixth transistor comprising a gate coupled to the first node, a first terminal for receiving the second clock signal, and a second terminal coupled to a carry output node;

a seventh transistor comprising a gate coupled to the second node, a first terminal coupled to the carry output node, and a second terminal for receiving a second gate off voltage that is different from the first gate off voltage;

a second capacitor comprising a first electrode directly coupled to the first node, and a second electrode directly coupled to the carry output node; and an eighth transistor comprising a gate for receiving a next stage carry signal, a first terminal for receiving a carry signal at the carry output node, and a second terminal coupled to the first node.

16. The scan driver of claim 15, wherein the first through eighth transistors comprise n-type metal oxide semiconductor (NMOS) transistors, wherein the gate on voltage is a high gate voltage, wherein the first and second gate off voltages are first and second low gate voltages, respectively, and wherein the second low gate voltage is lower than the first low gate voltage.

17. The scan driver of claim 15, wherein the stages further comprise:

a ninth transistor comprising a gate for receiving the second clock signal, a first terminal coupled to the first node, and a second terminal; and a tenth transistor comprising a gate coupled to the second node, a first terminal coupled to the second terminal of the ninth transistor, and a second terminal coupled to the carry output node.

18. A display device comprising:

a display panel comprising pixels;

a data driver configured to provide data signals to the pixels;

a scan driver comprising stages configured to provide scan signals to the pixels; and a controller configured to control the data driver and the scan driver, wherein the stages comprise:

an input block configured to change a voltage of a first node to a gate on voltage based on an input signal;

a second node control block configured to control a voltage of a second node in response to a first clock signal and the voltage of the first node;

a scan output block configured to output a second clock signal as a corresponding scan signal of the scan signals in response to the voltage of the first node, and to output a first gate off voltage as the corresponding scan signal in response to the voltage of the second node, wherein the scan output block comprises a first capacitor comprising a first electrode directly coupled to the second node, and a second electrode for receiving the first gate off voltage;

a carry output block configured to output the second clock signal as a carry signal in response to the voltage of the first node, and to output a second gate off voltage that is different from the first gate off voltage as the carry signal in response to the voltage of the second node, wherein the carry output block further comprises a second capacitor comprising a first electrode directly coupled to the first node, and a second electrode directly coupled to a carry output node configured to output the carry signal; and a first node control block configured to transfer the carry signal to the first node in response to a next stage carry signal.

* * * * *